(12) United States Patent
Yoon et al.

(10) Patent No.: US 7,265,011 B2
(45) Date of Patent: Sep. 4, 2007

(54) METHOD OF MANUFACTURING A TRANSISTOR

(75) Inventors: Jae-Man Yoon, Seoul (KR); Dong-gun Park, Gyeonggi-do (KR); Makoto Yoshida, Gyeonggi-do (KR); Gyo-Young Jin, Seoul (KR); Jeong-dong Choe, Gyeonggi-do (KR); Sang-Yeon Han, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 231 days.

(21) Appl. No.: 10/898,484

(22) Filed: Jul. 22, 2004

(65) Prior Publication Data

US 2005/0048729 A1   Mar. 3, 2005

(30) Foreign Application Priority Data

Aug. 29, 2003   (KR) .................. 10-2003-0060331

(51) Int. Cl.
    *H01L 21/8238* (2006.01)
(52) U.S. Cl. .............. 438/217; 438/231; 438/232; 438/300; 438/305; 438/306
(58) Field of Classification Search .......... 438/303, 438/305, 306, 217, 300, 276, 301, 218, 231, 438/232, 242
See application file for complete search history.

(56) References Cited

U.S. PATENT DOCUMENTS

| 6,265,272 | B1 * | 7/2001 | Chen ..................... 438/300 |
| 6,319,807 | B1 * | 11/2001 | Yeh et al. ................ 438/595 |
| 6,348,385 | B1 | 2/2002 | Cha et al. ............... 438/287 |
| 6,514,827 | B2 * | 2/2003 | Kim et al. ............... 438/292 |
| 6,677,212 | B1 * | 1/2004 | Yoshioka et al. ........ 438/303 |
| 6,875,680 | B1 * | 4/2005 | Park ....................... 438/595 |
| 6,998,318 | B2 * | 2/2006 | Park ....................... 438/289 |
| 7,018,873 | B2 * | 3/2006 | Dennard et al. ......... 438/149 |
| 7,026,203 | B2 * | 4/2006 | Lee ........................ 438/183 |
| 7,064,038 | B2 * | 6/2006 | Kudo et al. ............. 438/296 |
| 2002/0037619 | A1 | 3/2002 | Sugihara et al. ........ 438/289 |
| 2002/0117698 | A1 | 8/2002 | Inumiya et al. ......... 257/288 |
| 2003/0219953 | A1 * | 11/2003 | Mayuzumi ............... 438/353 |

* cited by examiner

*Primary Examiner*—Matthew Smith
*Assistant Examiner*—Khiem Nguyen
(74) *Attorney, Agent, or Firm*—Marger Johnson & McCollom, P.C.

(57) ABSTRACT

A method of manufacturing a transistor according to some embodiments includes sequentially forming a dummy gate oxide layer and a dummy gate electrode on an active region of a semiconductor substrate, ion-implanting a first conductive impurity into source/drain regions to form first impurity regions, and ion-implanting the first conductive impurity to form second impurity regions that are overlapped by the first impurity regions. The method includes forming a pad polysilicon layer on the source/drain regions, sequentially removing the pad polysilicon layer and the dummy gate electrode from a gate region of the semiconductor substrate, annealing the semiconductor substrate, and ion-implanting a second conductive impurity to form a third impurity region in the gate region. The method includes removing the dummy gate oxide layer, forming a gate insulation layer, and forming a gate electrode on the gate region.

51 Claims, 24 Drawing Sheets

METHOD OF MANUFACTURING A TRANSISTOR

CROSS REFERENCE TO RELATED APPLICATIONS

This application claims priority from Korean Patent Application No. 2003-60331, filed on Aug. 29, 2003, the contents of which are herein incorporated by reference in their entirety for all purposes.

BACKGROUND OF THE INVENTION

1. Technical Field of the Invention

This disclosure relates to methods of manufacturing semiconductor devices, and more particularly, to a transistor manufacturing method that substantially reduces an annealing process after a local ion implantation of channel adjusting impurity, that controls a thermal ion diffusion of the channel adjusting impurity, and that prevents a junction leakage current.

2. Description of the Related Art

The continuous advancement for increased integration levels in semiconductor devices requires a miniaturization in the size of transistor components. Accordingly, as a length of a channel is reduced from a conventional long channel to a short channel under 0.5 µm, a depletion region of a source/drain region invades the channel, reducing the effective channel length and a threshold voltage. These short channel effects cause gate control to be lost from the transistor.

In order to prevent this short channel effect, a thickness of the gate insulation layer should be reduced, and a channel between source/drain regions, namely, a maximum width of the depletion region below a gate should be reduced. Furthermore, an annealing process may be performed in implanting the impurity ions or in etching the surface of the semiconductor substrate. This annealing can reduce damage to the semiconductor substrate surface and reduce lattice defects caused by the implantation of impurity ions or the etching of the semiconductor substrate surface. This annealing hastens a diffusion of the ion-implanted impurity to change a threshold value or increase a PN junction area or junction density and thus causes a junction leakage current.

FIGS. 1a to 1s are cross-sectional diagrams illustrating a method of manufacturing transistors according to the conventional art.

Referring to FIG. 1a, a pad oxide layer 12, a molding polysilicon layer 14, and a hard mask layer 16 are sequentially formed on a semiconductor substrate 10 doped with a P-type impurity.

Referring to FIG. 1b, a photoresist is deposited on the hard mask layer 16, and is then patterned so as to partially expose the hard mask layer 16 through a photolithography process, and the hard mask layer 16 is selectively etched to expose the molding polysilicon layer 14 through the patterning and to define an active region A.

With reference to FIG. 1c, the molding polysilicon layer 14, the pad oxide layer 12, and the semiconductor substrate 10 are removed partially and sequentially by using the hard mask layer 16 as an etch mask, to form a trench T in the interior of the semiconductor substrate 10.

With reference to FIG. 1d, the molding polysilicon layer 14 and the surface of the semiconductor substrate 10 exposed by a thermal oxide process are selectively oxidized by using the hard mask layer 16 as an oxide stop mask, and a device isolation film 18 is formed in the interior of the trench T through the thermal oxide process. The molding polysilicon layer 14 serves as a buffer layer for mitigating a stress of a volume expansion generated in forming the device isolation film 18. Further, a chemical mechanical polishing or etch back is performed to expose a portion of semiconductor substrate 10 on which the device isolation film 18 is formed, to thus remove all the hard mask layer 16, the molding polysilicon layer 14, and the pad oxide layer 12 and to flatten the semiconductor substrate 10.

In FIG. 1e, active regions A of the semiconductor substrate 10 are individually divided into a cell region X and a core/peri region Y. On the core/peri region Y, a photoresist P or a sacrificial oxide layer is formed, and a P-type impurity, such as boron (B) or $BF_2$, of low dose is selectively ion-implanted into the active region A of the cell region X, to form a third impurity region 22 of low density. The photoresist P or the sacrificial oxide layer formed on the core/peri region Y is removed.

Referring to FIG. 1f, on the entire face of the cell region X and on the semiconductor substrate 10 of the core/peri region Y where a PMOS transistor is formed, the photoresist P or the sacrificial oxide layer is formed and the P-type impurity of low dose such as B or $BF_2$ is ion-implanted thereinto to thus form the third impurity region 22 of low density, and then the photoresist P or the sacrificial oxide layer is removed.

Referring to FIG. 1g, on the entire face of the cell region X and on the semiconductor substrate 10 of the core/peri region Y where the NMOS transistor is formed, a photoresist P is formed. An N-type impurity of low dose such as Phosphorus (P) or Arsenic (As) is ion-implanted into a remaining portion of the core/peri region Y to thus form the third impurity region 22 of low density and to remove the photoresist P.

In FIG. 1h, a thermal oxide process is performed on the semiconductor substrate 10 to form a gate oxide layer 24 with a determined thickness, and a gate electrode 26 is formed on the gate oxide layer 24 by using polysilicon containing a conductive impurity. A conductive metal layer 28 is formed on the gate electrode 26, and a gate upper insulation layer 30 is formed on the conductive metal layer 28 by using a silicon oxide layer etc. The gate electrode 26 can have a conductivity by implanting the N-type impurity into the polysilicon through use of $POCl_3$ precipitation or an ion implantation process.

In FIG. 1i, the photoresist is deposited on the gate upper insulation layer 30, and a photoresist pattern is formed on a gate region G through a photolithography process. Then, the gate upper insulation layer 30, the conductive metal layer 28, and the gate electrode 26 are sequentially removed so as to expose a portion of the gate oxide layer 24 by using the photoresist pattern as an etch mask, and subsequently, the photoresist pattern is removed.

In FIG. 1j, the photoresist P is deposited on an entire face of the semiconductor substrate 10. Next the photoresist P is patterned to expose the cell region X, and an N-type impurity of low dose such as P or As, is ion implanted into source/drain regions S/D exposed by the gate electrode 26 to form a first impurity region 32 of low density. Then the photoresist P is removed.

Referring to FIG. 1k, the photoresist P is deposited on an entire face of the semiconductor substrate 10, and the photoresist P is patterned to expose a formation portion of the NMOS transistor on the core/peri region Y. The N-type impurity of low dose, such as P or As, is ion implanted into the source and drain regions S/D exposed by the gate electrode 26 by using the photoresist P and the gate electrode 26 of the core/peri region Y as an ion implantation mask, to thus form the first impurity region 32 of low density and to remove the photoresist P.

With reference to FIG. 11, the photoresist P is deposited on an entire face of the semiconductor substrate 10, and the photoresist P is patterned to expose a formation portion of the PMOS transistor on the core/peri region Y. The N-type impurity of low dose, such as P or As, is ion implanted into the source and drain regions S/D exposed by the gate electrode 26 by using the photoresist P and the gate electrode 26 of the core/peri region Y as an ion implantation mask, to thus form the first impurity region 32 of low density and to remove the photoresist P. After that, in order to reduce a lattice defect of the silicon semiconductor substrate 10 generated by the ion implantation, an annealing process of a high temperature, e.g., about 800° C., is performed.

In FIG. 1m, a silicon nitride layer is formed on an entire face of the semiconductor substrate 10, and a spacer 34 is formed in a sidewall of the gate upper insulation layer 30 and the gate electrode 26.

In FIG. 1n, the photoresist P is deposited on an entire face of the semiconductor substrate 10, and the photoresist P is patterned to expose a formation portion of the NMOS transistor on the core/peri region Y. Also, an N-type impurity of high dose is ion implanted by using as an ion implantation mask the photoresist P, the gate electrode 26 corresponding to the formation portion of the NMOS transistor of the core/peri region Y, and the spacer, to thus form a second impurity region 36 of high density and to remove the photoresist P.

In FIG. 1o, the photoresist P is deposited on an entire face of the semiconductor substrate 10, and the photoresist P is patterned to expose a formation portion of the PMOS transistor on the core/peri region Y. Also, a P-type impurity of high dose is ion implanted by using as an ion implantation mask the photoresist P, the gate electrode 26 corresponding to the formation portion of the PMOS transistor of the core/peri region Y, and the spacer, to thus form the second impurity region 36 of high density and to remove the photoresist P.

In FIG. 1p, the first interlayer insulation layer 38 is formed of silicon nitride on the semiconductor substrate 10 on which the second impurity region 36 is formed, and is also flattened through the chemical mechanical polishing or etch-back so as to expose the gate upper insulation layer 30 or the spacer 34.

Referring to FIG. 1q, the photoresist P is deposited on the first interlayer insulation layer 38, and is then patterned to expose the first interlayer insulation layer 38 provided on the source/drain regions S/D of the cell region X. Furthermore, the first interlayer insulation layer 38 is removed to expose the dummy gate oxide layer 24 by using the photoresist P as an etch mask. Then, the photoresist P is removed.

With reference to FIG. 1r, the N-type impurity of high dose is ion implanted by using as an ion implantation mask the first interlayer insulation layer 38 of the core/peri region Y, and the spacer 34 and the gate electrode 26 of the cell region X, to thus form the second impurity region 36 of high density on the source/drain regions S/D of the cell region X, and the photoresist P is then removed. After the ion implantation process, an annealing process of high temperature, e.g., about 800° C., is performed.

With reference to FIG. 1s, the gate oxide layer 24 on the source/drain regions S/D of the cell regions X and the core/peri region Y is removed, and a pad polysilicon layer 40 is formed of polysilicon containing a conductive impurity on the semiconductor substrate 10. The pad polysilicon layer 40 is flattened through the chemical mechanical polishing (CMP) or the etch back so as to partially expose the spacer and the gate upper insulation layer 30. Then, an annealing process of high temperature, e.g., about 830° C., is performed to reduce a surface defect of the semiconductor substrate 10 corresponding to the source/drain regions S/D under the pad polysilicon layer 40.

Though not shown in the drawing, a second interlayer insulation layer is formed on the pad polysilicon layer 40, and is then removed from the upper part of the source region S to thus form a first contact hole. Also, a bit line contact electrically connected with the pad polysilicon layer 40 through the first contact hole is formed, and a third interlayer insulation layer is formed on the semiconductor substrate 10 involving the bit line contact. The second and third interlayer insulation layers on the drain region are removed to form a second contact hole, and thereon, a storage electrode electrically connected with the pad polysilicon layer 40 of the cell transistor through the second contact hole, a dielectric layer and a plate electrode are sequentially formed, to complete a capacitor of a memory cell.

However, the above conventional transistor manufacturing method exhibits the following problems.

A junction area between the third impurity region formed on the entire active region of the semiconductor substrate and the first impurity region formed on the source/drain regions, becomes extended in a subsequent process. Furthermore, the channel adjusting impurity is diffused into the first impurity region, causing the junction area to be widened and a junction leakage current to increase, due to several annealing processes, such as an annealing process performed after the ion implantation of the channel adjusting impurity in forming the third impurity region, and such as an annealing process of high temperature performed after the formation of the pad polysilicon layer.

Embodiments of the invention address these and other disadvantages of the conventional art.

SUMMARY OF THE INVENTION

Embodiments of the invention provide a method of manufacturing a transistor that prevents a junction leakage current by locally ion-implanting a channel adjusting impurity into a channel region after forming a pad polysilicon layer and that substantially reduces an annealing process after the local ion implantation.

BRIEF DESCRIPTION OF THE DRAWINGS

The above and other features of exemplary embodiments of the invention will become readily apparent from the description of the exemplary embodiments that follows, with reference to the attached drawing.

DETAILED DESCRIPTION OF THE INVENTION

Hereinafter, examplary embodiments of the invention will be described in detail with reference to FIGS. 2 to 3. This invention may be embodied in many different forms and should not be construed as being limited to the example embodiments set forth herein; rather, these example embodiments are provided so that this disclosure is thorough and complete, and conveys the concept of the invention to those skilled in the art.

Figure 1A:
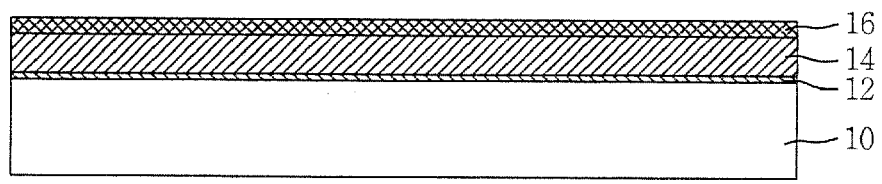
FIGS. 1a to 1s are cross-sectional diagrams illustrating a conventional transistor manufacturing process.
Figure 1B:
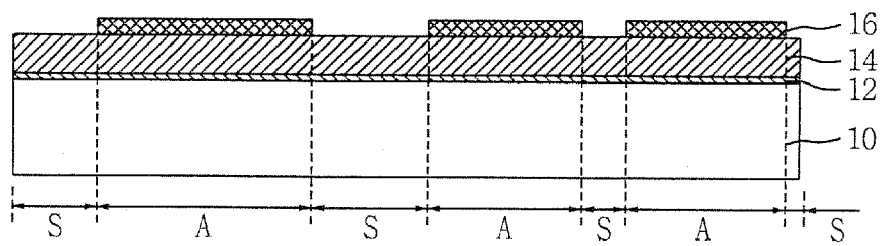
Figure 1C:
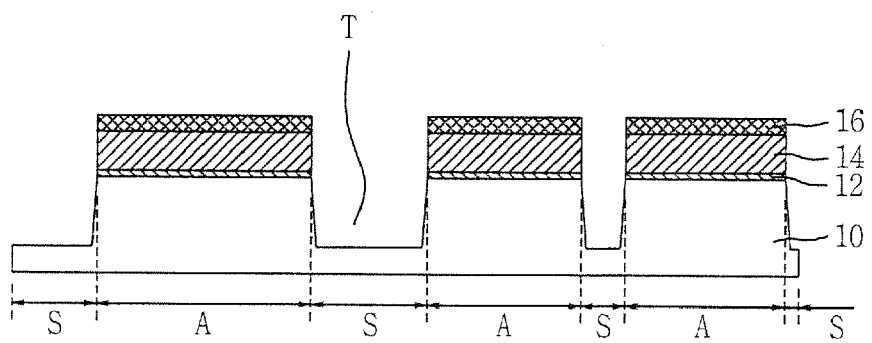
Figure 1D:
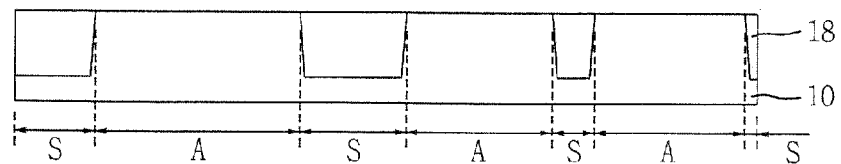
Figure 1E:
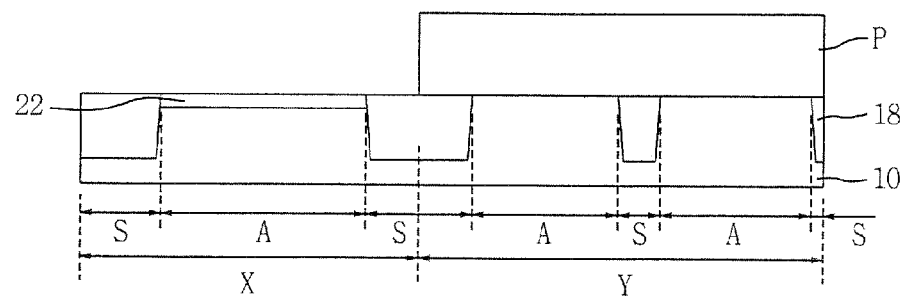
Figure 1F:
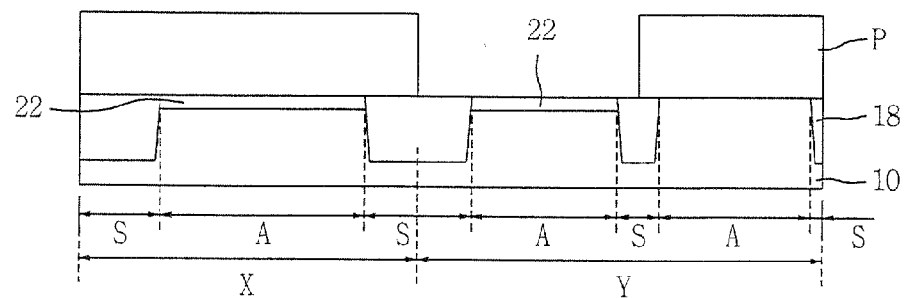
Figure 1G:
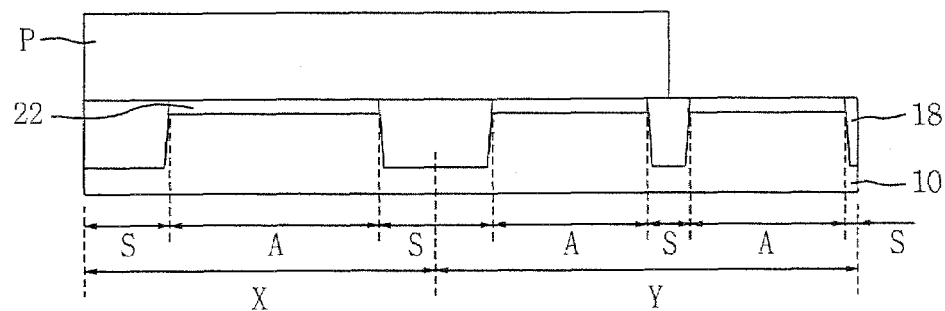
Figure 1H:
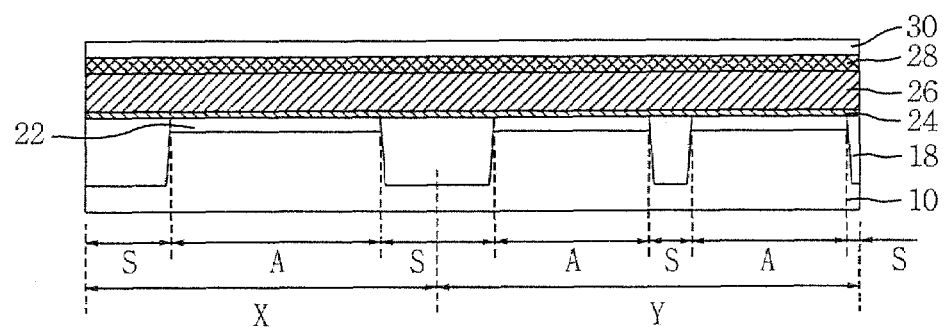
Figure 1I:
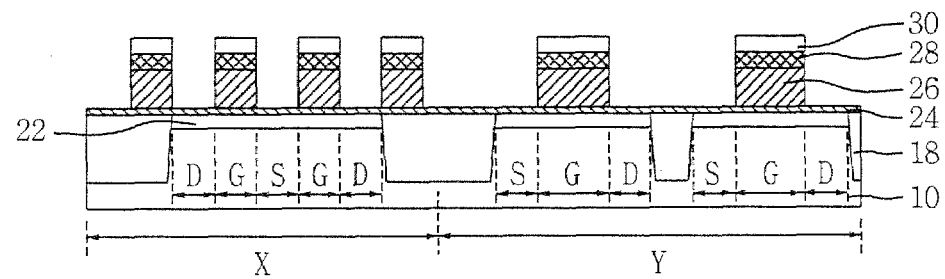
Figure 1J:
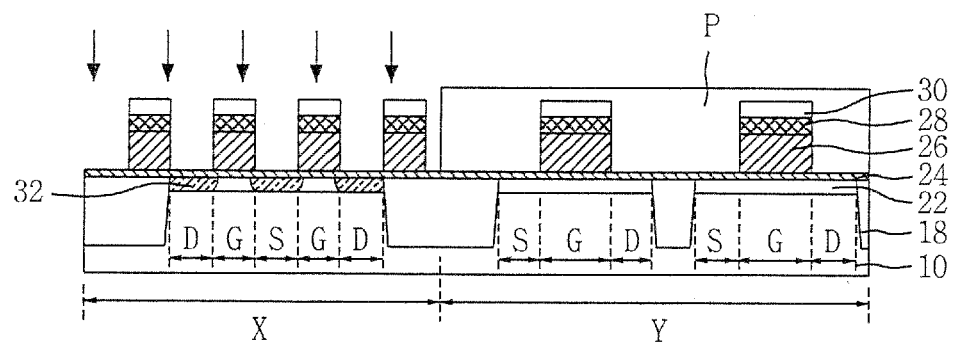
Figure 1K:
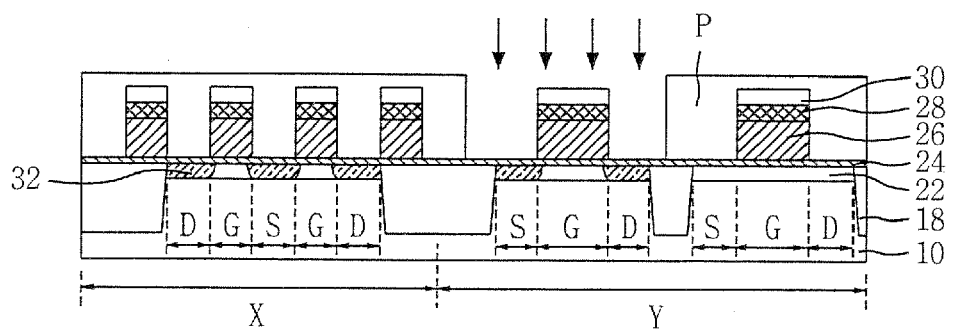
Figure 1L:
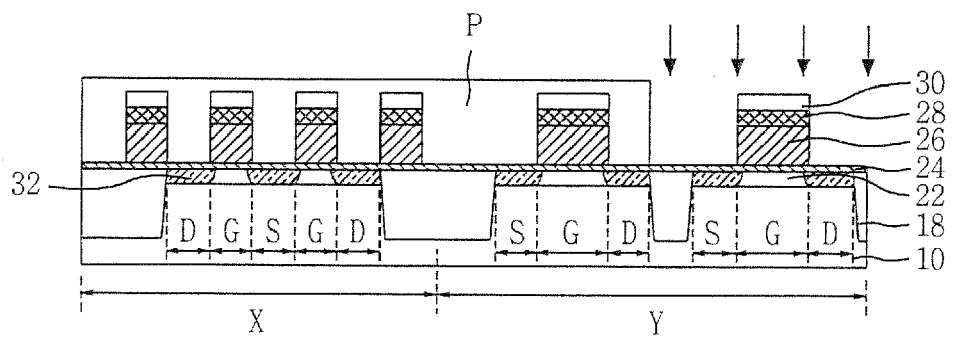
Figure 1M:
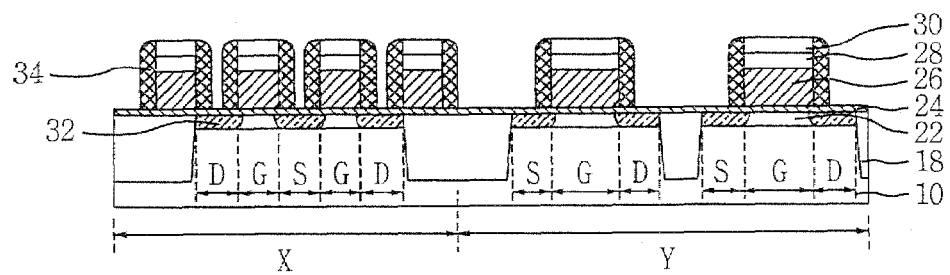
Figure 1N:
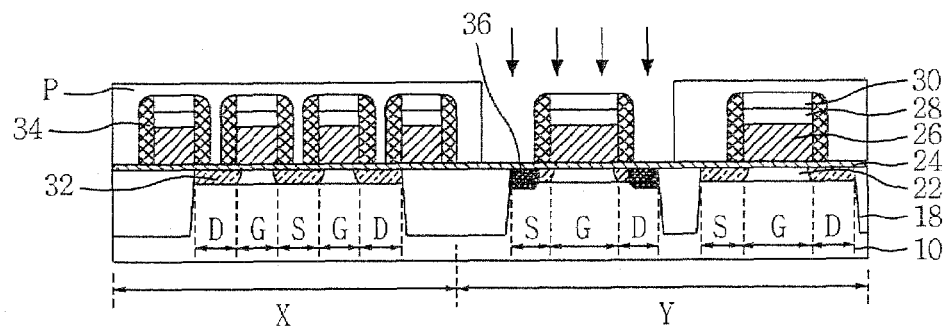
Figure 1O:
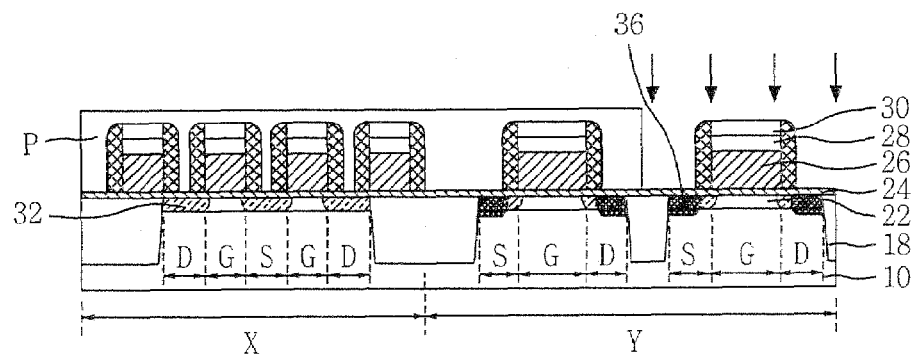
Figure 1P:
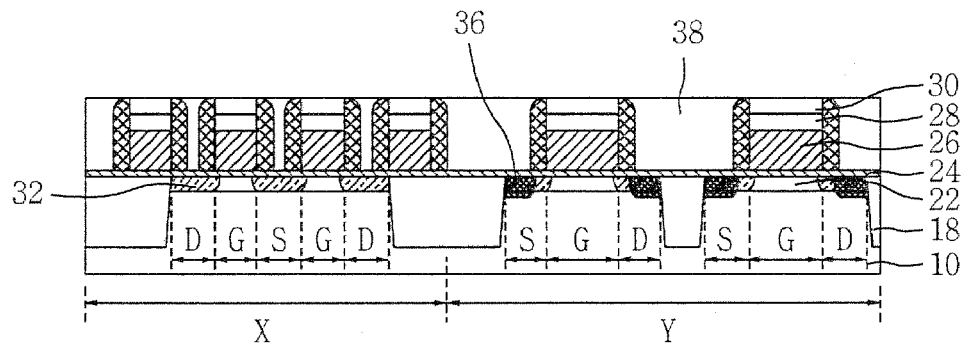
Figure 1Q:
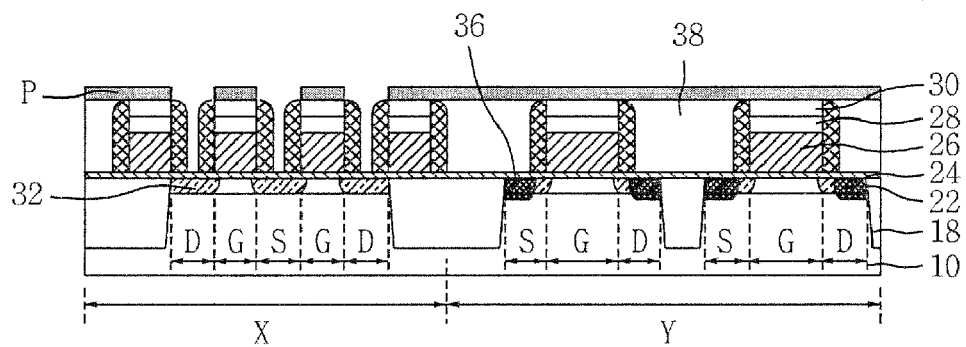
Figure 1R:
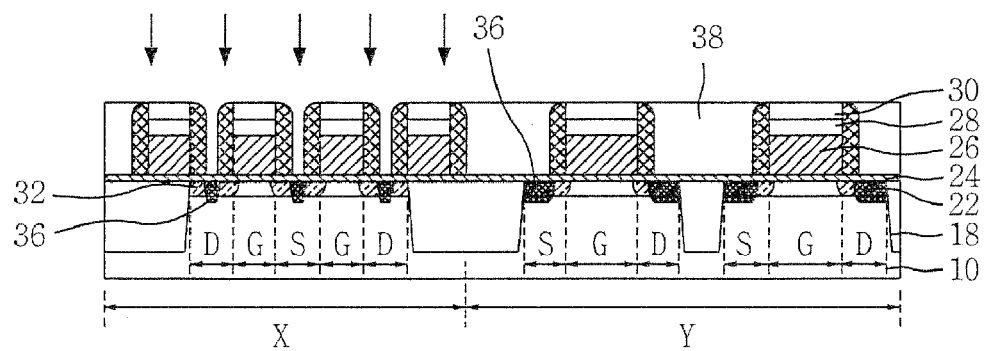
Figure 1S:
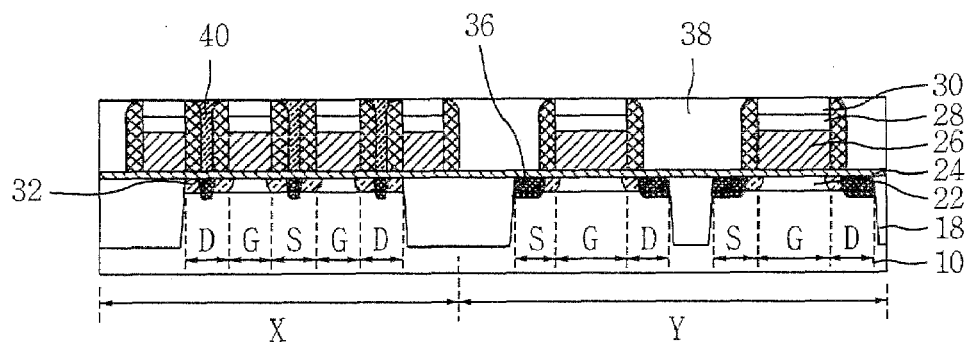
Figure 2A:
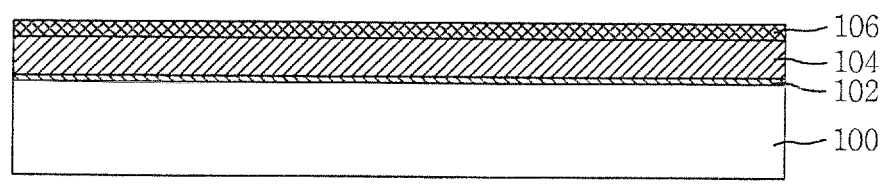
FIGS. 2a to 2x are cross-sectional diagrams illustrating a transistor manufacturing process according to some embodiments of the invention.
Figure 2B:
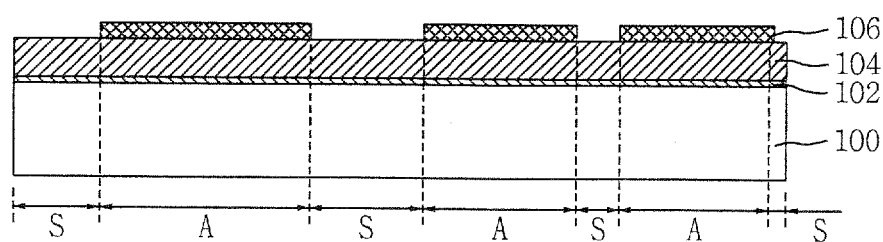
Figure 2C:
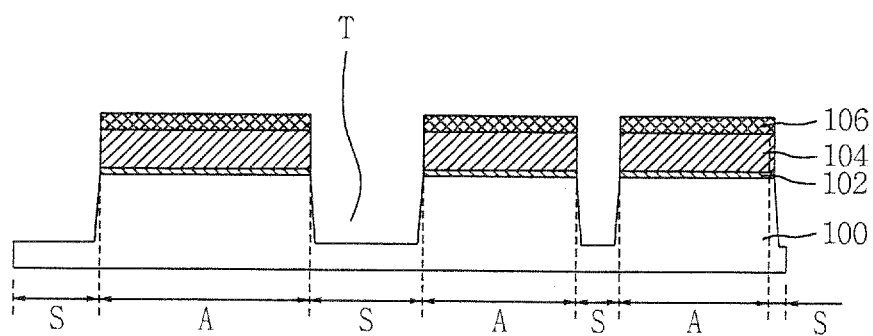
Figure 2D:
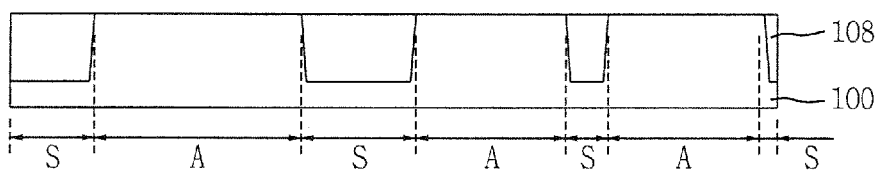
Figure 2E:
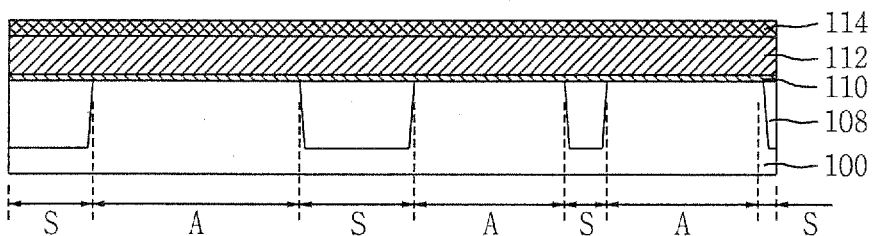
Figure 2F:
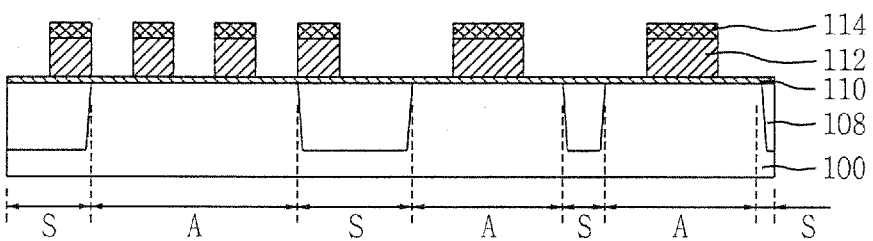
Figure 2G:
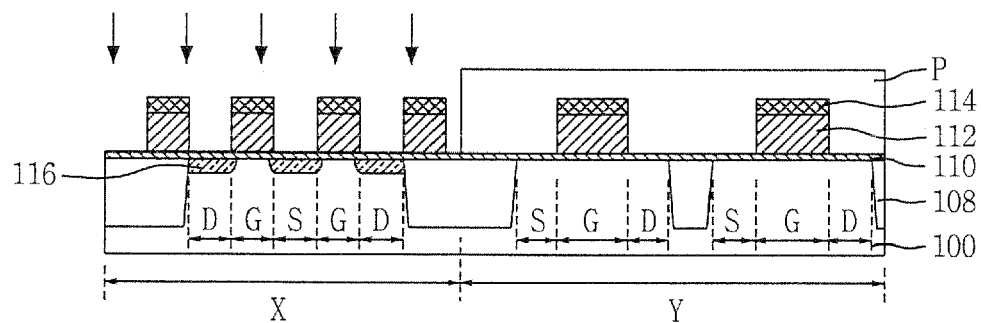
Figure 2H:
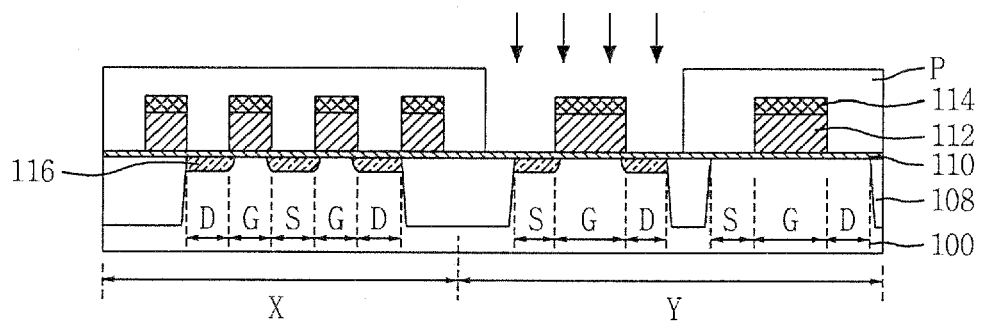
Figure 2I:
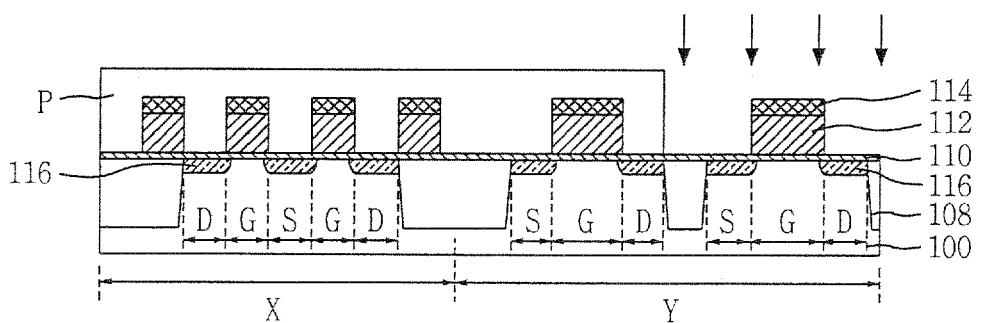
Figure 2J:
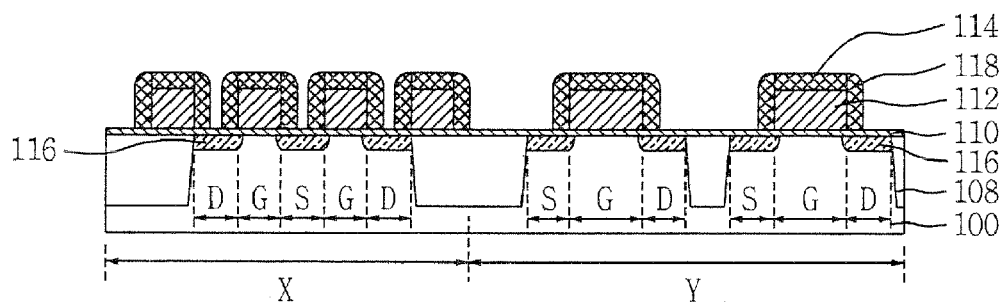
Figure 2K:
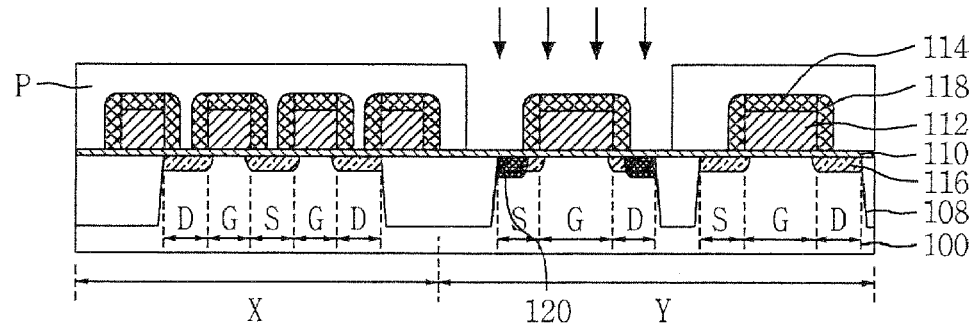
Figure 2L:
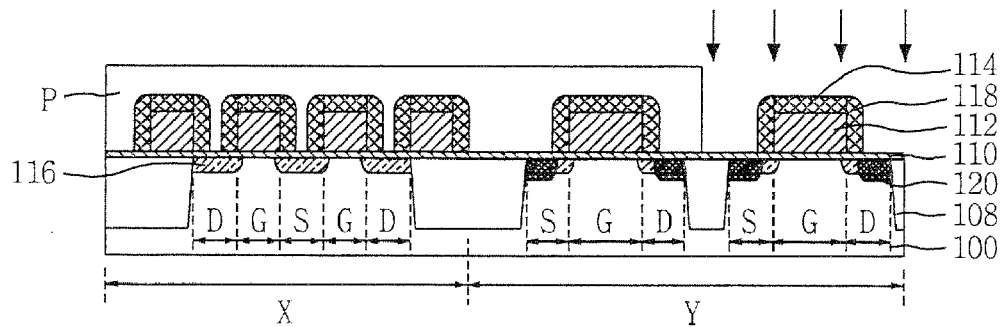
Figure 2M:
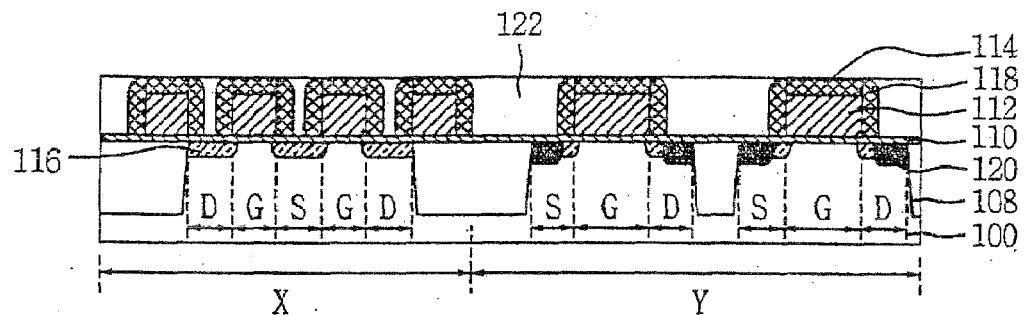
Figure 2N:
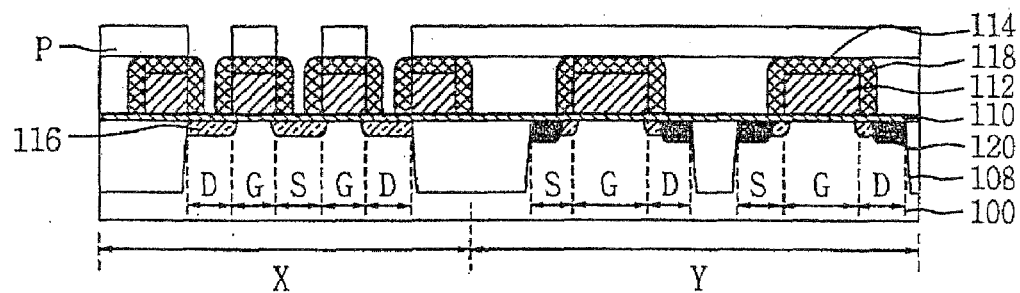
Figure 2O:
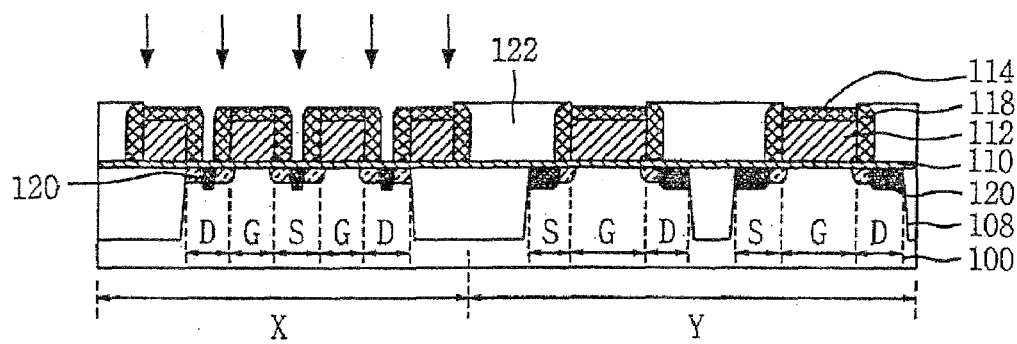
Figure 2P:
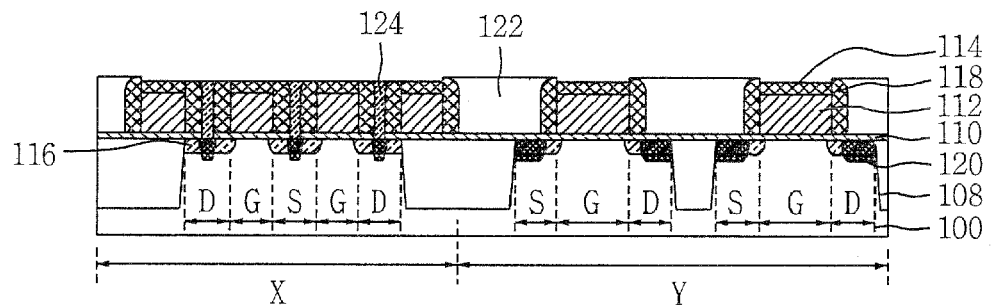
Figure 2Q:
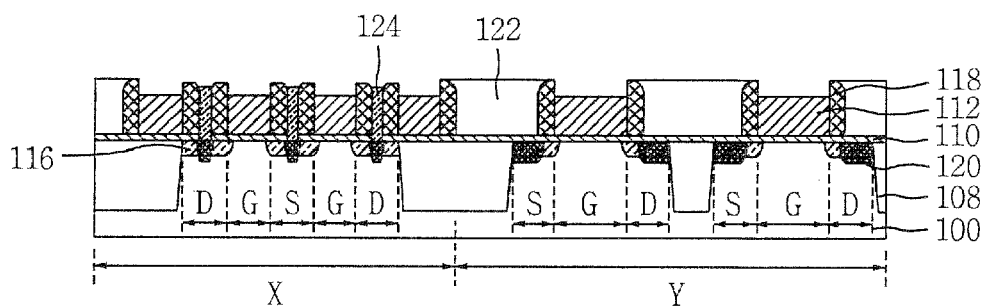
Figure 2R:
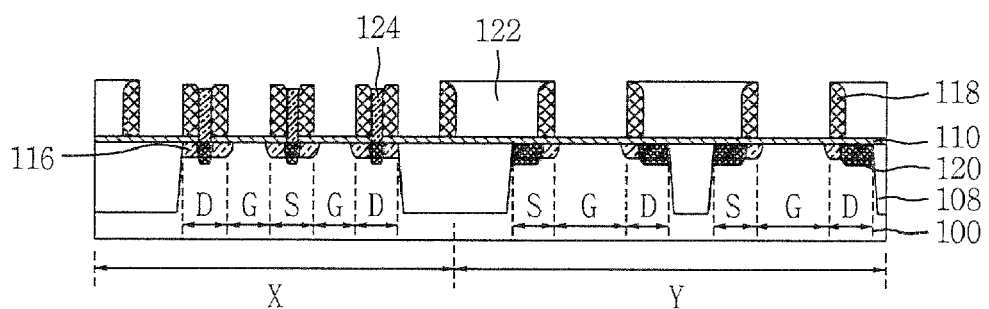
Figure 2S:
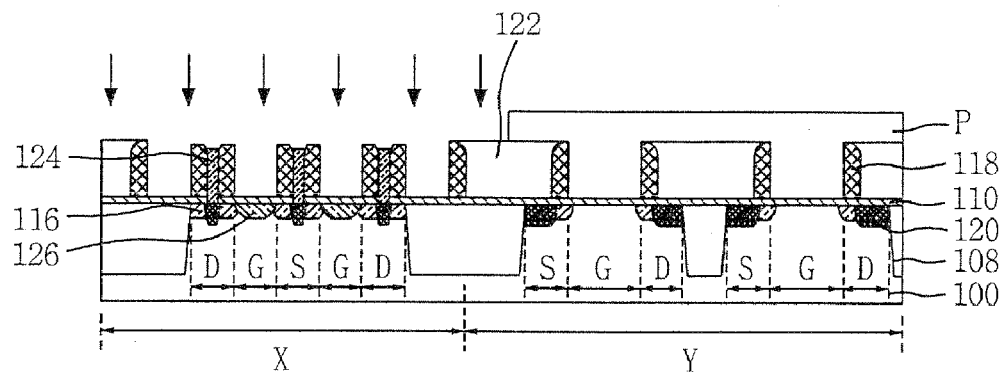
Figure 2T:
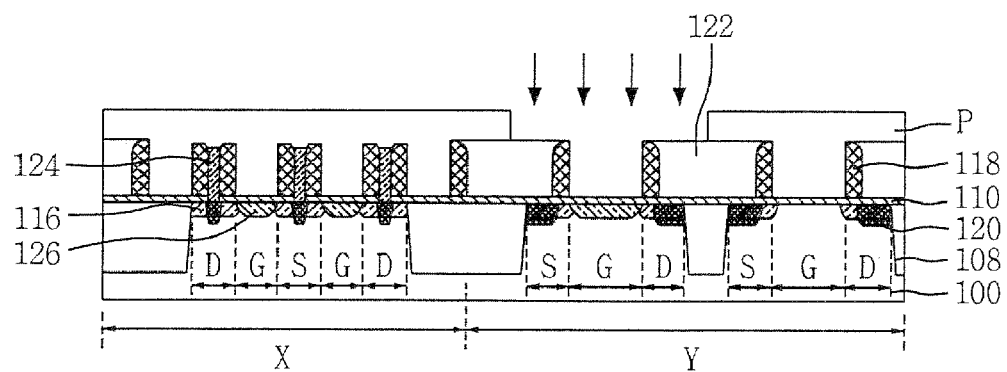
Figure 2U:
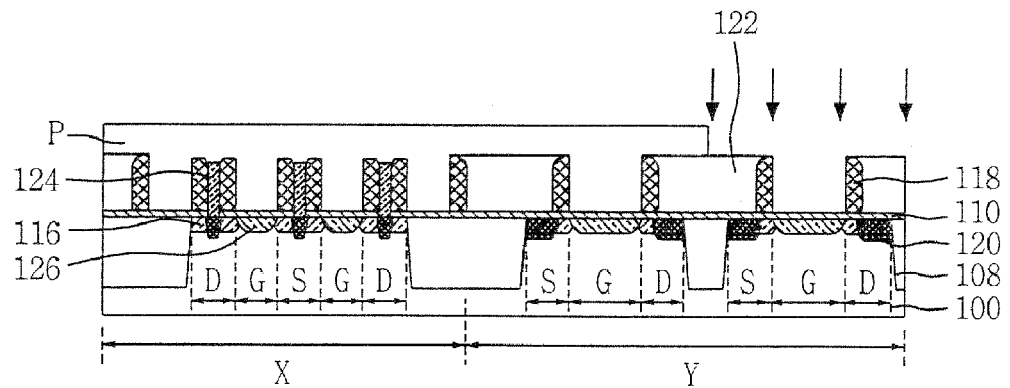
Figure 2V:
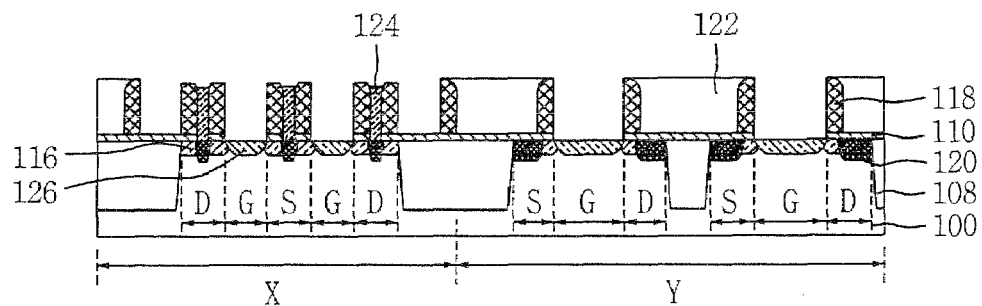
Figure 2W:
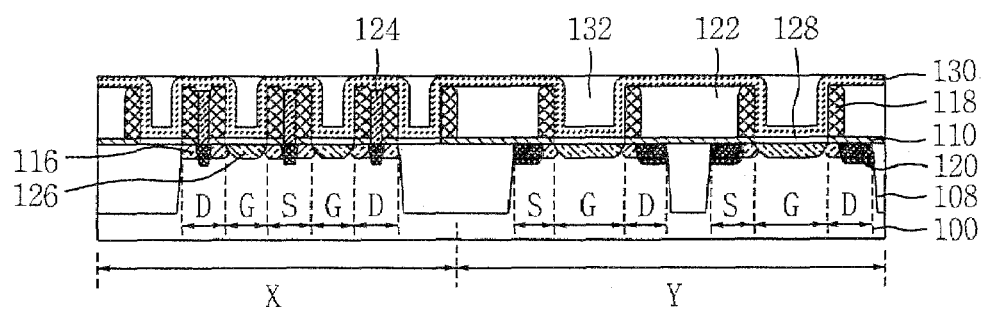
Figure 2X:
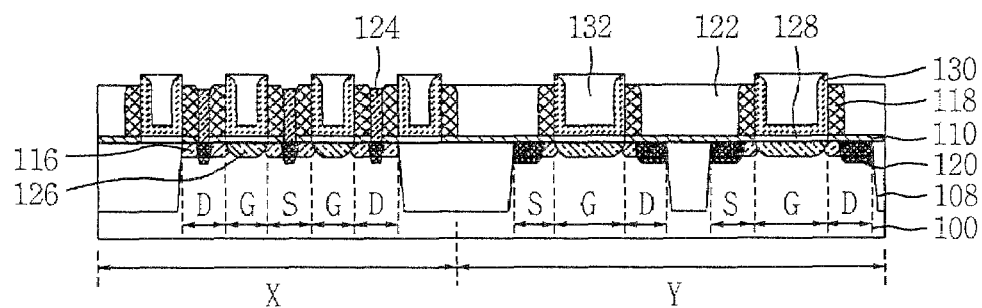

FIGS. 2a to 2x are cross-sectional diagrams illustrating a transistor manufacturing process according to some embodiments of the invention.

Referring to FIG. 2a, a pad oxide layer 102, a molding polysilicon layer 104, and a hard mask layer 106 are sequentially formed on a semiconductor substrate 100. The molding polysilicon layer 104 is formed through a chemical vapor deposition (CVD), and the hard mask layer 106 is formed of silicon nitride or silicon oxide nitride on the semiconductor substrate 100 by in-situ in the same chamber when forming the molding polysilicon layer 104.

With reference to FIG. 2b, a photoresist is deposited on the hard mask layer 106 and is then patterned, and the hard mask layer 106 is selectively etched by using the photoresist as an etch mask to define an active region A. This etching process of the hard mask layer 106 employs an anisotropic etching, and the molding polysilicon layer 104 serves as an etch stop layer in the etching process of the hard mask layer 106.

In FIG. 2c, the molding polysilicon layer 104, the pad oxide layer 102, and the semiconductor substrate 100 are partially and sequentially removed by using the hard mask layer 106 as an etch mask, forming a trench T. The etching process on the molding polysilicon layer 104, the pad oxide layer 102, and the semiconductor substrate 100 is performed through a dry etching, and the dry etching is performed with respectively different etching rates based on a kind of layer material through use of respectively different kinds of reactive gases, thus thin films of numerous layers can be etched sequentially. That is, in etching the molding polysilicon layer 104, the pad oxide layer 102 serves as an etching stop layer, likewise, the etching of the pad oxide layer 102 and the semiconductor substrate 100 can be performed through the same method. At this time, the trench T is formed with a determined depth, e.g., about 2000 Å to 5000 Å.

In FIG. 2d, a device isolation film 108 is formed of field oxide layer in the interior of the trench T formed in the semiconductor substrate 100. The molding polysilicon layer 104 and the surface of the semiconductor substrate 100 exposed through a thermal oxide process are selectively oxidized by using the hard mask layer 106 as an oxide stop mask, thus forming the device isolation film 108. The molding polysilicon layer 104 serves as a buffer layer for mitigating a stress of volume expansion generated in forming the device isolation film 108. Further, the semiconductor substrate 100 on which the device isolation film 108 is formed is flattened through a CMP or etch back. This flattening is performed to flatten the surface of the semiconductor substrate 100 by removing the hard mask layer 106, the molding polysilicon layer 104, and the pad oxide layer 102.

In FIG. 2e, the thermal oxide process is performed on the semiconductor substrate 100, to form a dummy gate oxide layer 110 having a determined thickness, e.g., about 30 Å to 80 Å, and a dummy gate electrode 112 is formed of silicon germanium on the dummy gate oxide layer 110. On the dummy gate electrode 112, a dummy gate upper insulation layer 114 is formed of silicon nitride.

In FIG. 2f, a photoresist as a photosensitive layer is deposited on the dummy gate upper insulation layer 114, and the photoresist on the dummy gate insulation layer 114 of a gate region G is patterned, then the dummy gate upper insulation layer 114 and the dummy gate electrode 112 are sequentially removed to expose a portion of the dummy gate oxide layer 110 by using the photoresist as an etch mask. Next, the photoresist is removed.

Referring to FIG. 2g, the photoresist is deposited on the semiconductor substrate 100, and is then patterned to expose an active region of a cell region X. Next, a relatively low dose of N-type impurities, such as P or As, is ion implanted into source/drain regions S/D of the semiconductor substrate 100 exposed by the dummy gate electrode 112 by using the dummy gate upper insulation layer 114 of the cell region X as an ion implantation mask, thus forming first low density impurity regions 116, e.g., of about $1.0 \times 10^{16}$ atoms/cm$^3$. The photoresist is then removed. The ion implantation process of the N-type impurity is preferably performed at an energy of about 20 KeV (electron Volts) so that the first impurity region 116 has a shallow junction of about 1000 Å from the surface of the semiconductor substrate 100.

In FIG. 2h, the photoresist P is deposited on a face of the semiconductor substrate 100, and is then patterned to expose the dummy gate oxide layer 110 of the core/peri region Y where an NMOS transistor is formed. A relatively low dose of N-type impurities, such as P or As, is ion implanted into the source/drain regions of the core/peri region Y where the NMOS transistor is formed using the photoresist P and the dummy gate upper insulation layer 114 of the core/peri region Y as an ion implantation mask, thus forming first low density impurity regions 116, e.g., of about $1.0 \times 10^{16}$ atoms/cm$^3$. The photoresist is then removed.

Referring to FIG. 2i, the photoresist P is deposited on a face of the semiconductor substrate 100, and is then patterned to expose the dummy gate oxide layer 110 of the core/peri region Y where a PMOS transistor is formed. A relatively low dose of P-type impurities, such as B or BF$_2$, is ion implanted into the source/drain regions S/D of the core/peri region Y where the PMOS transistor is formed using the photoresist P and the dummy gate upper insulation layer 114 of the core/peri region Y as an ion implantation mask, thus forming first low density impurity regions 116, e.g., of about $1.0 \times 10^{16}$ atoms/cm$^3$. The photoresist is then removed. Then, the thermal process of high temperature, e.g., about 800° C., is performed to reduce a lattice defect of the semiconductor substrate 100 generated by the ion implantation.

According to alternative embodiments of the invention, before or after forming the first impurity region 116, a second channel stopper may be formed on each of the cell region X and the core/peri region Y. The second channel stopper may be formed of a conductive impurity that is opposite to a conductive impurity formed in the first impurity region 116, so as to have a tilt at a portion of the source/drain regions S/D and so as to invade a portion of the gate region G. At this time, the ion implantation process of the conductive impurity is performed at an energy of about 50 KeV so that the second channel stopper is formed with a deep junction, e.g., about 2000 Å from the surface of the semiconductor substrate 100.

With reference to FIG. 2j, a silicon nitride layer having a determined thickness is formed on the semiconductor substrate 100 involving the dummy gate upper insulation layer 114, and the photoresist is deposited on the silicon nitride layer and is then patterned to expose the silicon nitride layer provided on the source/drain regions S/D. Subsequently, the silicon nitride layer is removed through a partial etch by using the photoresist as an etch mask, and a spacer 118 is formed on an upper part of the dummy gate upper insulation layer 114 and on a sidewall of the dummy gate electrode 112.

In FIG. 2k, a photoresist P is deposited on a face of the semiconductor substrate 100, and is then patterned to expose a portion where the NMOS transistor of the core/peri region Y is formed. A relatively high dose of N-type impurities, such as P or As, is ion implanted into the source/drain regions S/D of the core/peri region Y where the NMOS transistor is formed using the photoresist P and the spacer 118 of the core/peri region Y as an ion implantation mask, thus forming second high density impurity regions 120, e.g., about $1.0 \times 10^{19}$ atoms/cm$^3$, to be overlapped by the first low density impurity regions 116, and to remove the photoresist P. The ion implantation process of the N-type impurity is performed at an energy of about 50 KeV so that the second impurity region 120 is formed with a determined depth, e.g., about 1000 Å to 2000 Å.

In FIG. 2l, a photoresist P is deposited on a face of the semiconductor substrate 100, and is then patterned to expose a portion where the PMOS transistor of the core/peri region Y is formed. A relatively high dose of P-type impurities, such as B or BF$_2$, is ion implanted into the source/drain regions S/D of the core/peri region Y where the PMOS transistor is formed using the photoresist P and the spacer 118 or the dummy gate upper insulation layer 114 of the core/peri region Y as an ion implantation mask, thus forming second high density impurity regions 120, e.g., about $1.0 \times 10^{19}$ atoms/cm$^3$, to be overlapped by the first low density impurity regions 116, and to remove the photoresist P.

In FIG. 2m, a first interlayer insulation layer 122 is formed of silicon nitride on the semiconductor substrate 100 where the second impurity regions 120 are formed, and is then performed for the CMP or etch back, and the semiconductor substrate 100 is flattened so as to expose the dummy gate upper insulation layer 114 or the spacer 118.

In FIG. 2n, the photoresist P is deposited on the first interlayer insulation layer 122, and is then patterned to expose the first interlayer insulation layer 122 provided on the source/drain regions S/D of the cell region X. The first interlayer insulation layer 122 is removed to expose the dummy gate oxide layer 110 by using the photoresist P as an etch mask. Next, the photoresist P is removed.

In FIG. 2o, a relatively high dose of N-type impurities, such as P or As, is ion implanted into a portion of the semiconductor substrate 100 on the source/drain regions S/D of the cell region X, by using the dummy gate upper insulation layer 114 or the spacer 118 of the cell region X as an ion implantation mask, thus forming second high density impurity regions 120, e.g., about $1.0 \times 10^{19}$ atoms/cm$^3$, to be overlapped by the first impurity regions 116 of low density. This ion implantation process of the N-type impurity ion is performed at an energy of about 50 KeV so that the second impurity region 120 is formed with a deep junction, e.g., about 2000 Å from the surface of the semiconductor substrate 100.

In FIG. 2p, the dummy gate oxide layer 110 provided on the source/drain regions S/D of the cell region X is removed, and a pad polysilicon layer 124 is formed through a chemical vapor deposition (CVD) on the semiconductor substrate on which the second impurity region 120 is formed, and CMP or etch back is performed to flatten the pad polysilicon layer 124 so as to expose the dummy gate upper insulation layer 114 or a portion of the spacer 118.

In FIG. 2q, the spacer 118 corresponding to an upper part of the dummy gate electrode 112 or the dummy gate upper insulation layer 114 is selectively removed through an anisotropic etching by using the pad polysilicon layer 124 as an etch mask.

In FIG. 2r, the dummy gate electrode 112 is etched and removed through a dry or wet method by using the pad polysilicon layer 124 and the spacer 118 as an etch mask. The dummy gate electrode 112 can be removed through an anisotropic etching by using a reactive gas or etchant having a prominent selective etching rate for the pad silicon layer 124. Though not shown in the drawing, a high temperature annealing process at, e.g., about 830° C., is performed in order to reduce surface defects of the semiconductor substrate 100 generated by the dry etching. The high-temperature annealing process is provided to reduce surface damage or defects on the semiconductor substrate 100 generated by the impurity ion implantation in forming the first and second impurity regions 116, 120. That is, the first and second impurity regions 116, 120 contain a large quantity of conductive impurity, and the pad polysilicon layer 124, are annealed at a high temperature so as to surround the damaged portion of the substrate surface with the high density impurity. Thus, if a voltage is applied to the source/drain regions, the substrate surface damaged portion is surrounded therewith and a junction leakage current can be reduced.

Thus, in a method of manufacturing the transistor according to some embodiments of the invention, the first impurity regions 116 and the second impurity regions 120 of the source/drain regions S/D are first formed, and then the high temperature annealing process can be performed and completed before an ion implantation process of a channel adjusting impurity, so as to reduce the surface damage of the semiconductor substrate 100 or the lattice defect caused by the ion implantation of the conductive impurity or the etching of first interlayer insulation layer 122 in forming the first and second impurity regions 116, 120.

In FIG. 2s, a photoresist P is deposited on the semiconductor substrate 100, and is then patterned to expose the dummy gate oxide layer 110 of the cell region X. A relatively low dose of P-type impurities, such as B or BF$_2$, is locally ion-implanted into the gate region by using the photoresist P and the spacer 118 of the cell region X as an ion implantation mask, thus forming a third low density impurity region 126, e.g., about $1.0 \times 10^{16}$ atoms/cm$^3$. Then, the photoresist P is removed. The third low density impurity region 126 is formed with a depth of about 1000 Å from the surface of the semiconductor substrate 100 by ion-implanting the P-type impurity through use of energy of about 20 KeV.

In alternative embodiments of the invention, a first high density channel stopper (not shown) e.g., about $1.0 \times 10^{19}$ atoms/cm$^3$, may be formed with a determined depth, e.g., under about 2000 Å, from the surface of the semiconductor substrate 100, by locally ion-implanting the N-type impurities into the semiconductor substrate 100 before or after forming the third impurity region 126. The first high density channel stopper may reduce short-channel effects by preventing bulk punch-through, which is a primary cause of the short-channel effect together with the shallow junction.

In FIG. 2t, a photoresist P is deposited on the semiconductor substrate 100, and is then patterned to expose a portion where the NMOS transistor of the core/peri region Y is formed. A relatively low dose of P-type impurities, such as B or BF$_2$, is locally ion-implanted through a self-alignment method by using the pad polysilicon layer 124 and the spacer 118 of the portion where the NMOS transistor is formed as an ion implantation mask, thus forming third low density impurity regions 126, e.g., about $1.0 \times 10^{16}$ atoms/ cm$^3$. Then, the photoresist P is removed. In alternative embodiments of the invention, in order to prevent a punch-through, a first high density channel stopper (not shown) may be formed with a determined depth, e.g., under about 2000 Å, from the surface of the semiconductor substrate 100, by locally ion-implanting the P-type impurities into the semiconductor substrate 100 before or after forming the third impurity region 126.

In FIG. 2u, a photoresist P is deposited on the semiconductor substrate 100, and is then patterned to expose a portion where the PMOS transistor of the core/peri region Y is formed. A relatively low dose of N-type impurities, such as P or As, is locally ion-implanted into the gate region G through a self-alignment method, by using the photoresist P and the spacer 118 of the portion where the PMOS transistor of the core/peri region Y is formed as an ion implantation mask, thus forming third low density impurity regions 126, e.g., about $1.0 \times 10^{16}$ atoms/cm$^3$. Then, the photoresist P is removed. Thus, the channel adjusting impurity is ion-implanted into the cell region X and the core/peri region Y alternately and sequentially, to individually form the third low density impurity regions 126. The channel adjusting impurities ion-implanted into each of the cell region X and the core/peri region Y may have respectively different densities, thus the threshold values of respective transistors may be different.

In alternative embodiments of the invention, a first channel stopper (not shown) may be formed with a determined depth, e.g., under about 2000 Å, from the surface of the semiconductor substrate 100, by locally ion-implanting a relatively high dose of N-type impurities into the semiconductor substrate 100 before or after forming the third impurity region 126, so as to prevent a punch-through that is a main cause of the short-channel effect together with the shallow junction. Then, the third impurity region 126 is stabilized, and in order to reduce a surface lattice defect of the semiconductor substrate 100, the semiconductor substrate 100 on which the third impurity region is formed may be annealed at a high temperature, e.g., about 800° C.

That is, in the method of manufacturing the transistor according to the above embodiments of the invention, the high temperature annealing process is first completed, and the third impurity regions 126 are then formed by the local ion implantation, thus the diffusion of the third impurity regions 126 generated by the annealing process of high temperature can be prevented, and a junction area between the first impurity region 116 and the third impurity region 126 can be substantially reduced to prevent a junction leakage current as compared with the conventional art.

In FIG. 2v, the dummy gate oxide layer 110 provided on the gate region G, which is exposed by the spacer 118 of the cell region X and the core/peri region Y, is removed by a dry or wet etching.

In FIG. 2w, a gate oxide layer 128 is formed on the semiconductor substrate 100 of the gate region G exposed from the first interlayer insulation layer 122, the spacer 118 and the pad polysilicon layer 124. A gate electrode 130 having a determined thickness, e.g., about 1000 Å to 2000 Å, is formed of polysilicon containing a conductive impurity on the semiconductor substrate 100 on which the gate oxide layer 128 is formed. Furthermore, a conductive metal layer 132 is formed of tungsten silicide on the semiconductor substrate on which the gate electrode 130 is formed; and the conductive metal layer 132 is flattened through the CMP or etch back so as to expose the gate electrode 130 of the source/drain regions S/D.

In FIG. 2x, the gate electrode 130 is etched and removed to expose the spacer 118 and the pad polysilicon layer 124 provided on the source/drain regions S/D by using the conductive metal layer 132 as an etch mask.

Thereafter, although not illustrated, a second interlayer insulation layer is formed, a first contact hole is formed in the second interlayer insulation layer provided on the pad polysilicon layer 124, a bit line contact electrically connected through the first contact hole is formed, and a third interlayer insulation layer is formed on the semiconductor substrate 100 involving the bit line contact. Also, a second contact hole is formed on the second and third interlayer insulation layers for exposing the pad polysilicon layer 124 on the upper part of the drain region D, and thereafter, a storage electrode, a dielectric layer, and a plate electrode are sequentially formed, thus completing the capacitor of the memory cell, the storage electrode being electrically connected to the pad polysilicon layer 124 provided on the drain region D of the cell transistor through the second contact hole.

Therefore, in the transistor manufacturing method based on the above embodiments of the invention, and in forming the third impurity region 126, the channel adjusting impurity is locally ion-implanted, and an annealing process is substantially reduced after forming the third impurity region 126 to prevent a diffusion of the third impurity region 126, thereby reducing a junction area with the first impurity region 116 and a junction leakage current.

Figure 3A:
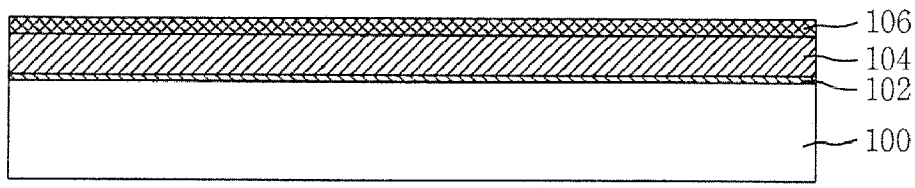
FIGS. 3a to 3y are cross-sectional diagrams showing a transistor manufacturing process according to other embodiments of the invention.
Figure 3B:
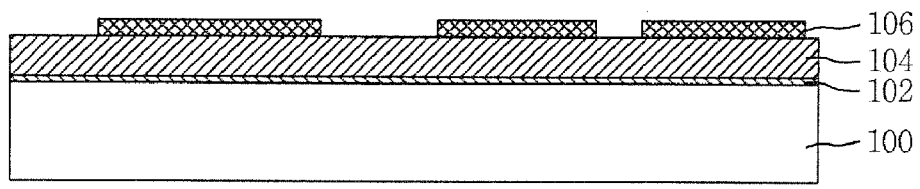
Figure 3C:
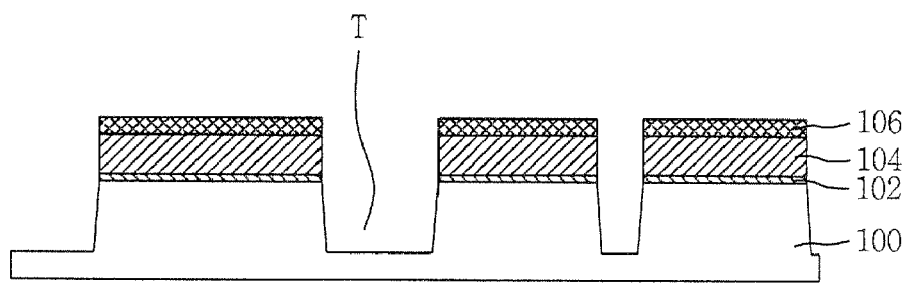
Figure 3D:
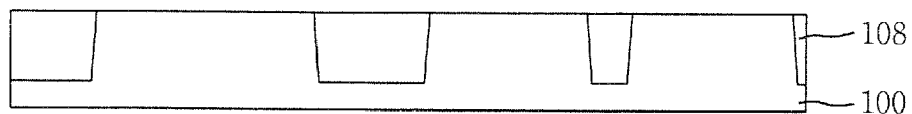
Figure 3E:
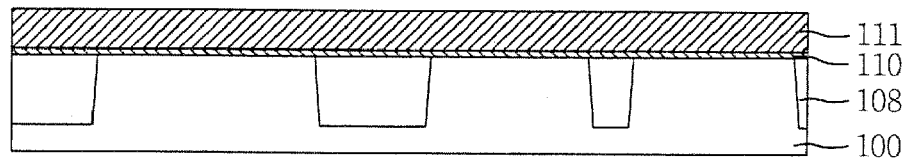
Figure 3F:
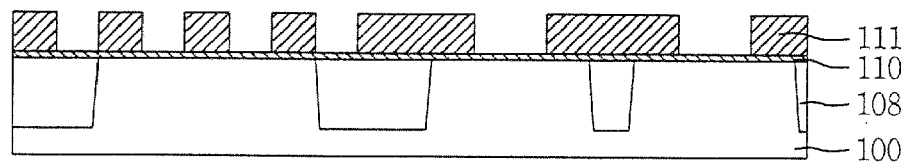
Figure 3G:
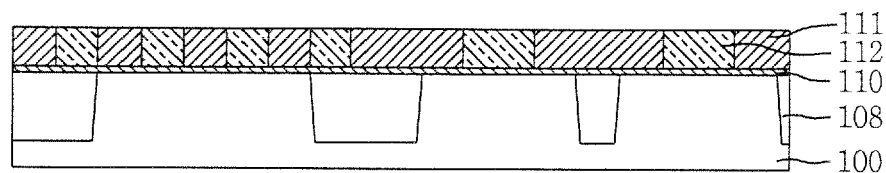
Figure 3H:
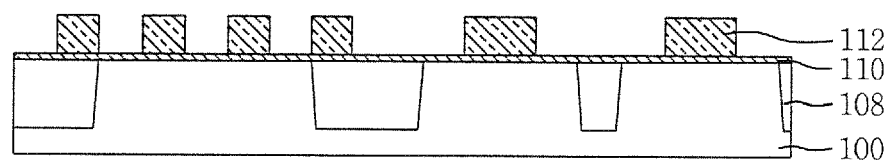
Figure 3I:
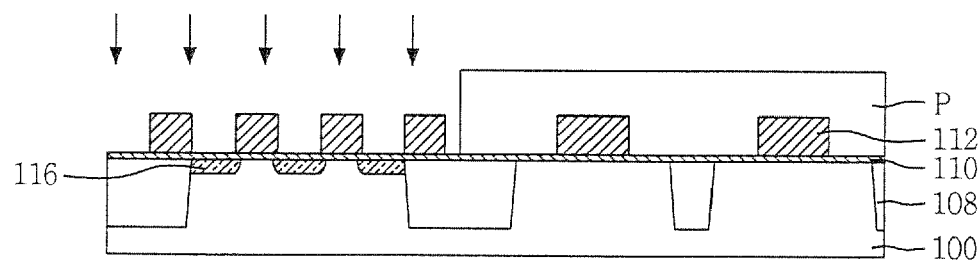
Figure 3J:
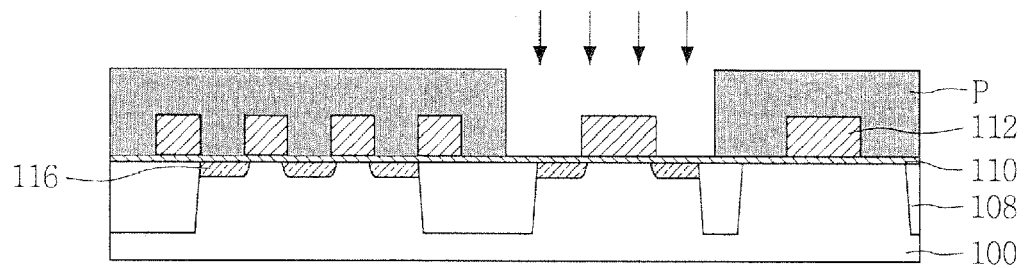
Figure 3K:
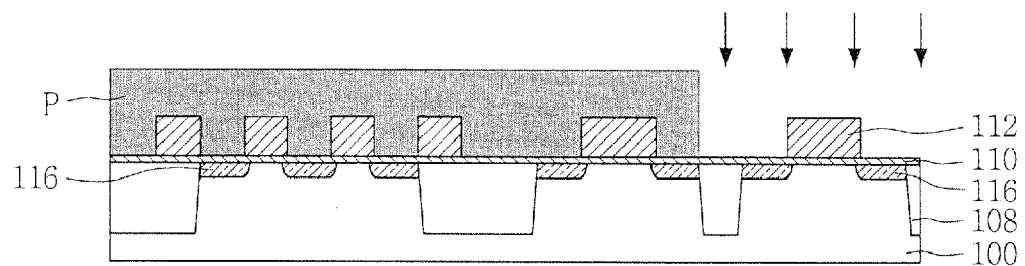
Figure 3L:
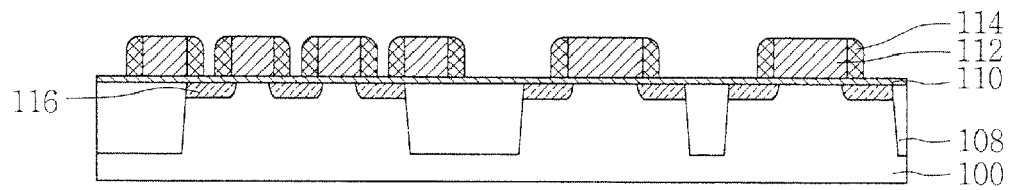
Figure 3M:
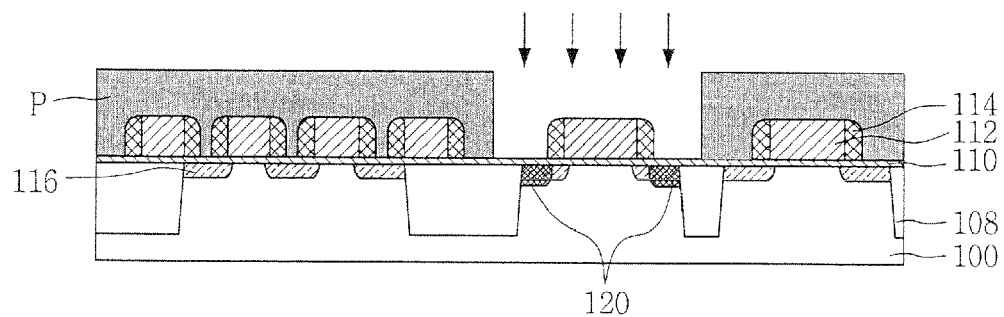
Figure 3N:
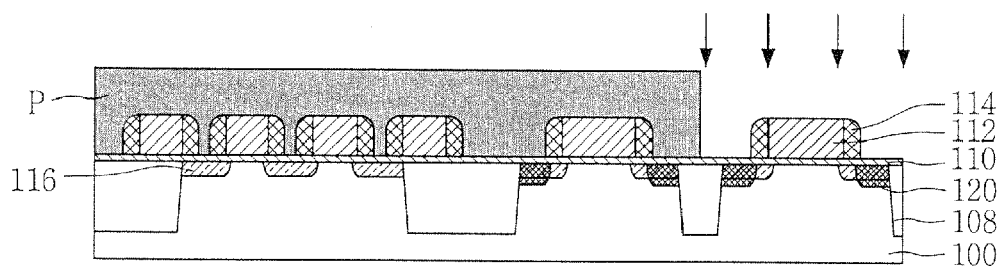
Figure 3O:
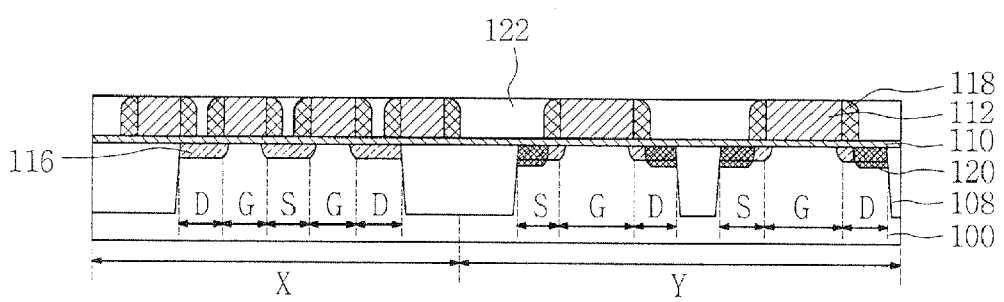
Figure 3P:
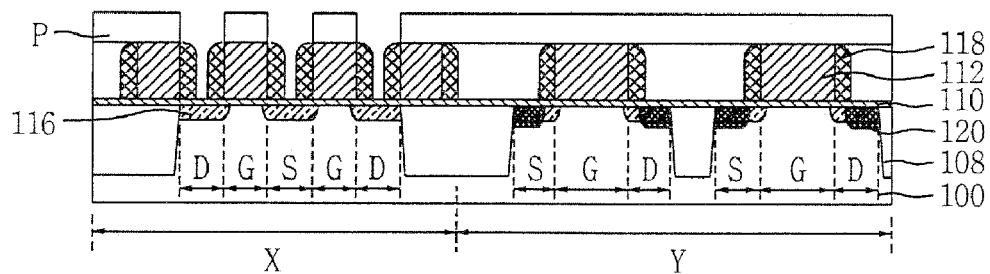
Figure 3Q:
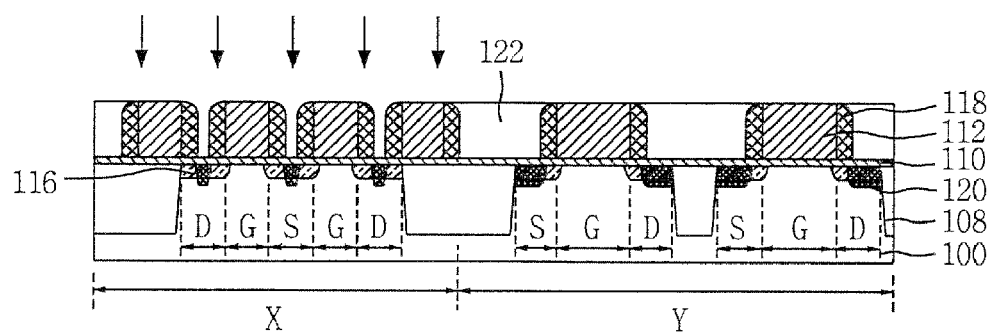
Figure 3R:
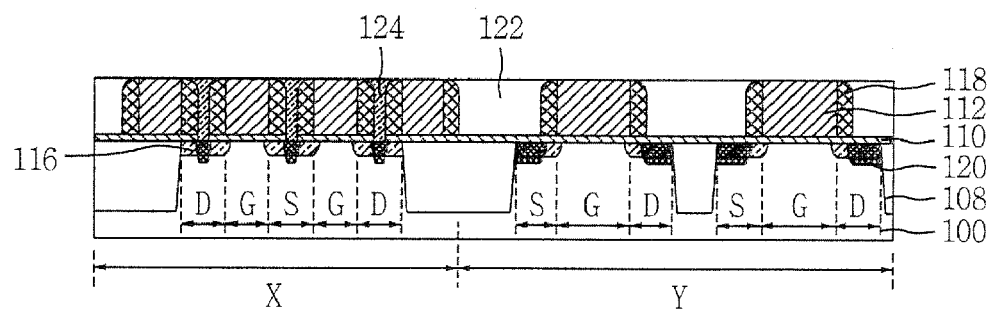
Figure 3S:
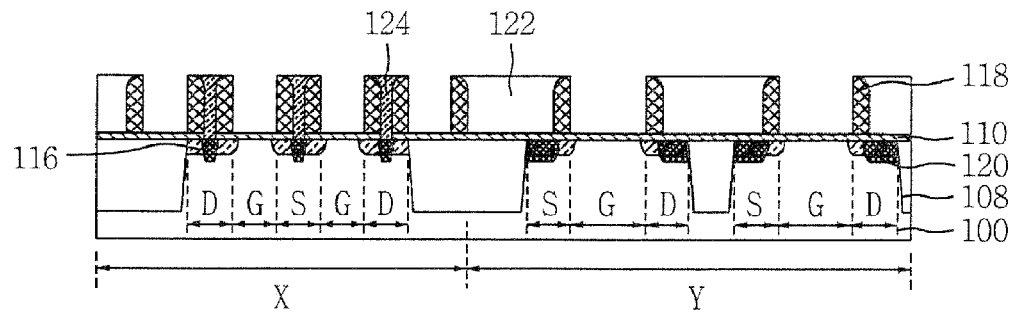
Figure 3T:
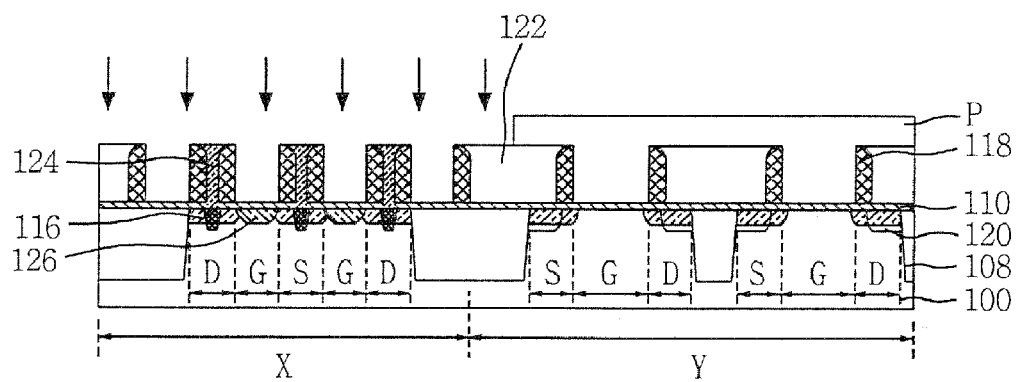
Figure 3U:
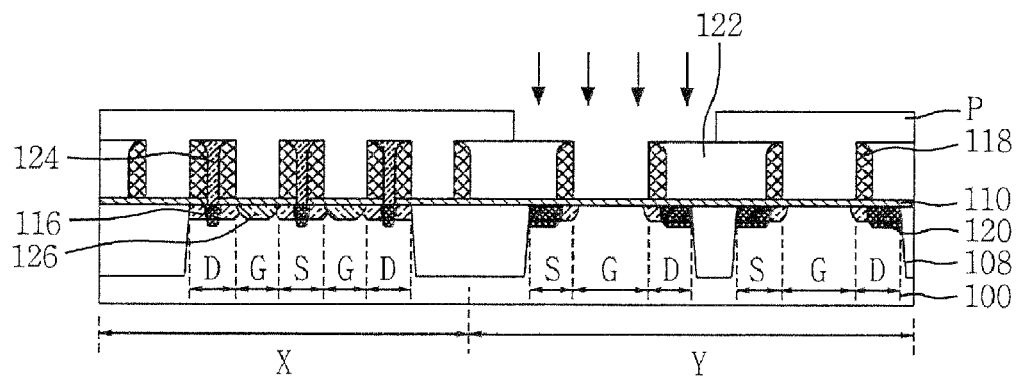
Figure 3V:
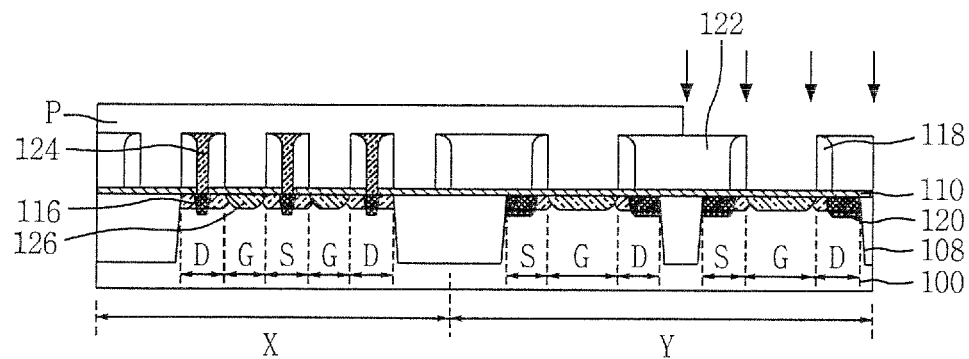
Figure 3W:
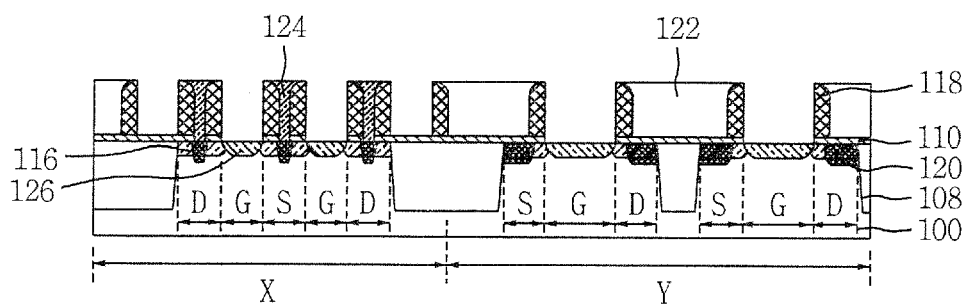
Figure 3X:
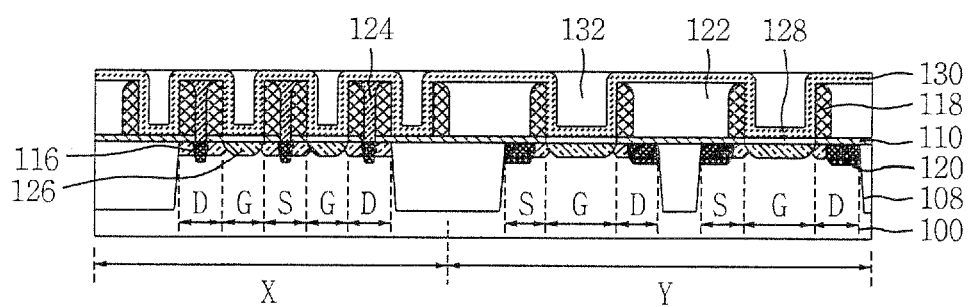
Figure 3Y:
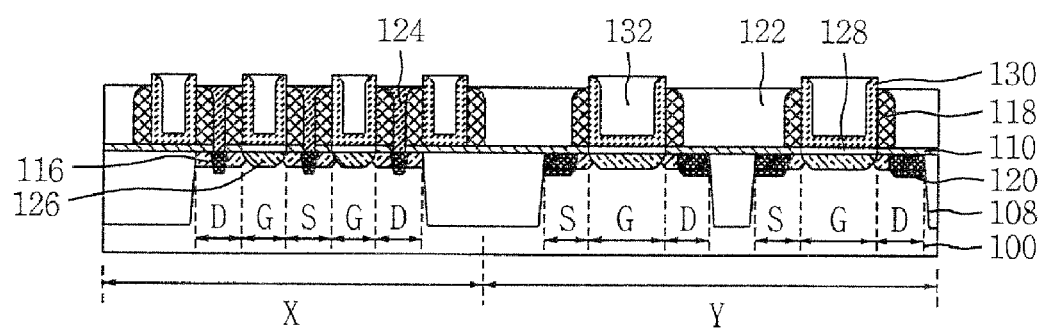

FIGS. 3a to 3y are cross-sectional diagrams illustrating a transistor manufacturing process according to other embodiments of the invention.

Referring to FIG. 3a, a pad oxide layer 102, a molding polysilicon layer 104, and a hard mask layer 106 are sequentially formed on the semiconductor substrate 100.

With reference to FIG. 3b, a photoresist is deposited on the hard mask layer 106 and is then patterned, and the hard mask layer 106 is selectively etched by using the photoresist as an etch mask to define the active region A. This etching process of the hard mask layer 106 employs an anisotropic etching, and the molding polysilicon layer 104 serves as an etch stop layer in the etching process of the hard mask layer 106.

In FIG. 3c, the molding polysilicon layer 104, the pad oxide layer 102, and the semiconductor substrate 100 are partially and sequentially removed by using the hard mask layer 106 as an etch mask, thus forming the trench T. Herewith, the etching process on the molding polysilicon layer 104, the pad oxide layer 102, and the semiconductor substrate 100 is performed through a dry etching, and the dry etching is performed with respectively different etching rates based on a kind of layer material through use of respectively different kinds of reactive gases, thus thin films of numerous layers can be etched sequentially. That is, in etching the molding polysilicon layer 104, the pad oxide layer 102 serves as an etching stop layer, likewise, the etching of the pad oxide layer 102 and the semiconductor substrate 100 can be performed through the same method. At this time, the trench T is formed with a determined depth, e.g., about 2000 Å to 5000 Å below the surface of the substrate 100.

In FIG. 3d, the device isolation film 108 is formed of a field oxide layer in the interior of the trench T. The molding polysilicon layer 104 and the surface of the semiconductor substrate 100 exposed through a thermal oxide process are selectively oxidized by using the hard mask layer 106 as an oxide stop mask, to thus form the device isolation film 108. The molding polysilicon layer 104 serves as a buffer layer for mitigating a stress of volume expansion generated in forming the device isolation film 108. Further, the semiconductor substrate 100 on which the device isolation film 108 is formed is flattened through the CMP or etch back. This flattening is performed to flatten the surface of the semiconductor substrate 100 by removing the hard mask layer 106, the molding polysilicon layer 104, and the pad oxide layer 102.

In FIG. 3e, a dummy gate oxide layer 110 and a sacrificial oxide layer 111 are accumulated with silicon oxide, silicon oxide nitride, or silicon nitride on the semiconductor substrate 100 using CVD. This dummy gate oxide layer 110 is formed with a determined thickness, e.g., about 30 Å to 80 Å, and the sacrificial oxide layer 111 is formed with a determined thickness, e.g., about 1500 Å to 3000 Å, so as to reach a height of the dummy gate electrode 112 provided in a subsequent process.

In FIG. 3f, a photoresist is deposited on the sacrificial oxide layer 111 and is then patterned to expose the sacrificial oxide layer 111 provided on a gate region. The sacrificial oxide layer 111 is removed to partially expose the dummy gate oxide layer 110 by using the photoresist as an etch mask, and next, the photoresist is removed.

Referring to FIG. 3g, the dummy gate electrode 112 is formed of silicon germanium on the semiconductor substrate 100 involving the sacrificial oxide layer 111, and a CMP process or etch back process is performed for the dummy gate electrode 112 so as to expose the sacrificial oxide layer 111 and to flatten the semiconductor substrate 100.

In FIG. 3h, the sacrificial oxide layer 111 is selectively removed through the anisotropic etching, to independently form the dummy gate electrode 112.

Referring to FIG. 3i, the photoresist is deposited on the semiconductor substrate 100, and is then patterned to expose an active region of the cell region X. Next, a relatively low dose of N-type impurities, such as P or As, is ion implanted into the source/drain regions S/D of the semiconductor substrate 100 exposed by the dummy gate electrode 112 by using the dummy gate electrode 112 of the cell region X as an ion implantation mask, thus forming first impurity regions 116 of low density, e.g., of about $1.0 \times 10^{16}$ atoms/cm$^3$. The photoresist is then removed. The N-type impurity ion implantation process is performed at an energy of about 20 KeV so that the first impurity regions 116 have a shallow junction of about 1000 Å from the surface of the semiconductor substrate 100.

In FIG. 3j, the photoresist P is deposited on a face of the semiconductor substrate 100, and is then patterned to expose the dummy gate oxide layer 110 of the core/peri region Y where an NMOS transistor is formed. A relatively low dose of N-type impurities, such as P or As, is ion implanted into the source/drain regions of the core/peri region Y where the NMOS transistor is formed, using the photoresist P and the dummy gate upper insulation layer 114 of the core/peri region Y as an ion implantation mask, thus forming first impurity regions 116 of low density, e.g., of about $1.0 \times 10^{16}$ atoms/cm$^3$. The photoresist is then removed.

Referring to FIG. 3k, the photoresist P is deposited on a face of the semiconductor substrate 100, and is then patterned to expose the dummy gate oxide layer 110 of the core/peri region Y where a PMOS transistor is formed. A relatively low dose of P-type impurities, such as B or BF$_2$, is ion implanted into the source/drain regions S/D of the core/peri region Y where the PMOS transistor is formed by using the photoresist P and the dummy gate upper insulation layer 114 of the core/peri region Y as an ion implantation mask, thus forming first impurity regions 116 of low density, e.g., of about $1.0 \times 10^{16}$ atoms/cm$^3$. The photoresist P is then removed. Then, a high temperature thermal process, e.g., about 800° C., is performed to reduce a lattice defect of the semiconductor substrate 100 generated by the ion implantation.

In alternative embodiments of the invention, either before or after forming the first impurity regions 116, a second channel stopper may be formed of a conductive impurity that is opposite to the conductive impurity formed in the first impurity region 116 and the second impurity region 120, so as to have a tilt at a portion of the source/drain regions S/D and so as to invade a portion of channel region. At this time, the ion implantation process of the conductive impurity is performed at an energy of about 50 KeV so that the second channel stopper is formed with deep junction of about 2000 Å below the surface of the substrate 100.

With reference to FIG. 3l, a silicon nitride layer having a determined thickness is formed on the semiconductor substrate 100 involving the dummy gate electrode 112, and the photoresist is deposited on the silicon nitride layer and is then patterned to expose the silicon nitride layer provided on the source/drain regions S/D. Subsequently, the silicon nitride layer is removed through a partial etch by using the photoresist as an etch mask, and the spacer 118 is formed in a sidewall of the dummy gate electrode 112 and the photoresist is removed.

In FIG. 3m, the photoresist P is deposited on a face of the semiconductor substrate 100, and is then patterned to expose a portion where the NMOS transistor of the core/peri region Y is formed. A relatively high dose of N-type impurities, such as P or As, is ion implanted into the source/drain regions S/D of the core/peri region Y where the NMOS transistor is formed by using the photoresist P and the spacer 118 of the core/peri region Y as an ion implantation mask, thus forming second impurity regions 120 of high density, e.g., about $1.0 \times 10^{19}$ atoms/cm$^3$, to be overlapped by the first impurity regions 116 of low density, and to remove the photoresist P. This N-type impurity ion implantation process is preferably performed at an energy of about 50 KeV so that the second impurity regions 120 are formed with a determined depth, e.g., about 1000 Å to 2000 Å.

In FIG. 3n, a photoresist P is deposited on a face of the semiconductor substrate 100, and is then patterned to expose a portion where the PMOS transistor of the core/peri region Y is formed. A relatively high dose of P-type impurities, such as B or BF$_2$, is ion implanted into the source/drain regions S/D of the core/peri region Y where the PMOS transistor is formed by using the photoresist P and the spacer 118 or the dummy gate upper insulation layer 114 of the core/peri region Y as an ion implantation mask, thus forming second impurity regions 120 of high density, e.g., of about $1.0 \times 10^{19}$ atoms/cm$^3$, to be overlapped by the first impurity regions 116. The photoresist P is then removed.

In FIG. 3o, the first interlayer insulation layer 122 is formed of silicon nitride on the semiconductor substrate 100 on which the second impurity region 120 is formed, and a CMP or etch back process is performed to flatten the first interlayer insulation layer 122 so that the dummy gate electrode 112 or the spacer 118 are exposed.

In FIG. 3p, the photoresist P is deposited on the first interlayer insulation layer 122, and is then patterned to expose the first interlayer insulation layer 122 provided on the source/drain regions S/D of the cell region X. The first interlayer insulation layer 122 is removed to expose the dummy gate oxide layer 112 by using the photoresist P as an etch mask. Next, the photoresist P is removed.

In FIG. 3q, a relatively high dose of N-type impurities, such as P or As, is ion implanted into a portion of the semiconductor substrate 100 on the source/drain regions S/D of the cell region X by using the dummy gate electrode 112 or the spacer 118 of the cell region X as an ion implantation mask, thus forming second impurity regions 120 of high density, e.g., of about $1.0 \times 10^{19}$ atoms/cm$^3$, to be overlapped by the first impurity regions 116 of low density. This ion implantation process of the N-type impurity ion is preferably performed at an energy of about 50 KeV so that the second impurity region 120 is formed with a deep junction, e.g., about 2000 Å from the surface of the semiconductor substrate 100.

In FIG. 3r, the dummy gate oxide layer 110 provided on the source/drain regions S/D of the cell region X is removed. A pad polysilicon layer 124 is formed through a CVD process on the semiconductor substrate 100 on which the second impurity region 120 is formed. Next, a CMP or etch back process is performed to flatten the pad polysilicon layer 124 so as to expose the dummy gate electrode 112 or a portion of the spacer 118.

In FIG. 3s, the dummy gate electrode 112 is selectively removed through the anisotropic etching by using the pad polysilicon layer 124 and the spacer 118 as an etch mask. This dummy gate electrode 112 can be removed through the anisotropic etching by using a reactive gas or etchant having a prominent selective etching rate for the pad silicon layer 124 and the spacer 118. Though not shown in the drawing, an implantation of conductive impurity into the first and second impurity regions 116, 120 is performed and an annealing process of high temperature, e.g., about 830° C., is performed to reduce a surface defect of the semiconductor substrate 100 generated by the dry etching.

That is, in the method of manufacturing the transistor according to the second example embodiment of the invention, the first and second impurity regions 116, 120 of the source/drain regions S/D are first formed, and then the annealing process of high temperature can be completed before an ion implantation process of the channel adjusting impurity, to reduce a surface damage of the semiconductor substrate 100 or a lattice defect caused by the ion implantation of conductive impurity or the etching of the first interlayer insulation layer 122 in forming the first and second impurity regions 116, 120.

In FIG. 3t, a photoresist P is deposited on the semiconductor substrate 100, and P is then patterned to expose the dummy gate oxide layer 110 of the cell region X. A relatively low dose of P-type impurities, such as B or BF$_2$, is locally ion-implanted into the gate region by using the photoresist P and the spacer 118 of the cell region X as an ion implantation mask, thus forming third impurity regions 126 of low density, e.g., of about $1.0 \times 10^{16}$ atoms/cm$^3$. Then, the photoresist P is removed. The third impurity region 126 is preferably formed by an ion implantation at an energy of about 20 KeV, with a depth under about 1000 Å from the surface of the semiconductor substrate 100.

Though not shown in the drawing, in order to solve a short-channel effect and prevent a bulk punch-through that is a main cause of the short-channel effect together with the shallow junction, a first channel stopper (not shown) may be formed with a determined depth, e.g., under about 2000 Å, from the surface of the semiconductor substrate 100, by locally ion-implanting a relatively high dose of N-type impurities into the semiconductor substrate 100 either before or after forming the third impurity regions 126.

In FIG. 3u, a photoresist P is deposited on the semiconductor substrate 100, and is then patterned to expose a portion where the NMOS transistor of the core/peri region Y is formed. A relatively low dose of P-type impurities, such as B or BF$_2$, is locally ion-implanted through a self-alignment method by using the pad polysilicon layer 124 and the spacer 118 of the portion where the PMOS transistor is formed as an ion implantation mask, thus forming third impurity regions 126 of low density, e.g., of about $1.0 \times 10^{16}$ atoms/cm$^3$. Then, the photoresist P is removed. Thought not shown in the drawing, in order to prevent the punch-through, a first channel stopper (not shown) may be formed with a determined depth, e.g., under about 2000 Å, from the surface of the semiconductor substrate 100, by locally ion-implanting a relatively high dose of P-type impurities into the semiconductor substrate 100 either before or after forming the third impurity region 126.

In FIG. 3v, a photoresist P is deposited on the semiconductor substrate 100, and is then patterned to expose a portion where the PMOS transistor of the core/peri region Y is formed. A relatively low dose of N-type impurities, such as P or As, is locally ion-implanted into the gate region G through the self-alignment method by using the photoresist P and the spacer 118 of the portion where the PMOS transistor of the core/peri region Y is formed as an ion implantation mask, thus forming third impurity regions 126 of low density, e.g., of about $1.0 \times 10^{16}$ atoms/cm$^3$. Then, the photoresist P is removed. Thus, the channel adjusting impurity is ion-implanted into the cell region X and the core/peri region Y alternately and sequentially, to individually form the third impurity regions 126. Since the channel adjusting impurities ion-implanted into each of the cell region X and the core/peri region Y have respectively different densities, the threshold values of respective transistors may be different. Though not shown in the drawing, in order to prevent the punch-through, a first channel stopper (not shown) may be formed with a determined depth, e.g., under about 2000 Å, from the surface of the semiconductor substrate 100, by locally ion-implanting a relatively high dose of N-type impurities into the semiconductor substrate 100 either before or after forming the third impurity regions 126. Then, the third impurity regions 126 are stabilized, and in order to reduce the surface lattice defect, a process of annealing at a high temperature, e.g., about 800° C., may be used on the semiconductor substrate 100 where the third impurity regions 126 are formed.

That is, in the method of manufacturing the transistor according to the embodiments of the invention illustrated in FIGS. 3a-3v, the annealing process of high temperature is completed and the third impurity regions 126 are then formed by the local ion implantation, thus the diffusion of third impurity regions 126 generated by the annealing process of high temperature can be prevented, and a junction area between the first impurity region 116 and the third impurity region 126 can be substantially reduced to prevent a junction leakage current as compared with the conventional art.

In FIG. 3w, the dummy gate oxide layer 110 provided on the gate region G, which is exposed by the spacer 118 of the cell region X and the core/peri region Y, is removed by a dry or wet etching.

In FIG. 3x, a gate oxide layer 128 is formed on the semiconductor substrate 100 of the gate region G exposed from the first interlayer insulation layer 122, the spacer 118, and the pad polysilicon layer 124. A gate electrode 130 having a determined thickness, e.g., about 1000 Å to 2000 Å, is formed of polysilicon containing a conductive impurity on the semiconductor substrate 100 on which the gate oxide layer 128 is formed. Furthermore, the conductive metal layer 132 is formed of tungsten silicide on the semiconductor substrate on which the gate electrode 130 is formed; and the conductive metal layer 132 is flattened through a CMP or etch back process so as to expose the gate electrode 130 of the source/drain regions S/D.

In FIG. 3y, the gate electrode 130 is etched and removed to expose the spacer 118 and the pad polysilicon layer 124 provided on the source/drain regions S/D by using the conductive metal layer 132 as an etch mask.

Thereon, though not shown in the drawing, a second interlayer insulation layer is formed, a first contact hole is formed in the second interlayer insulation layer provided on the pad polysilicon layer 124 on the source region S, a bit line contact electrically connected through the first contact hole is formed, and a third interlayer insulation layer is formed on the semiconductor substrate 100 involving the bit line contact. Also, a second contact hole is formed in the second and third interlayer insulation layers to expose the pad polysilicon layer 124 on the upper part of the drain region D, and thereon, a storage electrode, a dielectric layer and a plate electrode, which are electrically connected to the pad polysilicon layer 124 provided on the drain region D of the cell transistor through the second contact hole, are sequentially formed, thus completing the capacitor of the memory cell.

Therefore, in the transistor manufacturing method according to the embodiments of the invention illustrated in FIGS. 3a-3y, an annealing process of high temperature is completed after forming the pad polysilicon layer 124, and the channel adjusting impurity is locally ion-implanted in forming the third impurity region 126, and after forming the third impurity region 126, the annealing process is substantially reduced so as to prevent the diffusion of the third impurity region 126. Whereby, the junction area with the first impurity region 116 is reduced and the junction leakage current can be also reduced.

As was described above, in the transistor manufacturing method based on example embodiments of the invention, an annealing process is substantially reduced after a channel adjusting impurity implantation, thus a diffusion of the channel adjusting impurity caused by the annealing process is prevented and a PN junction area is reduced. Therefore, a junction leakage current can be reduced compared to the conventional art.

The invention may be practiced in many ways. What follows are exemplary, non-limiting descriptions of embodiments of the invention.

According to some embodiments of the invention, a method of manufacturing a transistor includes, sequentially forming a dummy gate oxide layer, a dummy gate electrode, and a dummy gate upper insulation layer on a semiconductor substrate, and ion-implanting a first conductive impurity into source/drain regions provided in both sides of the dummy gate electrode, thus forming first impurity regions. The method includes forming a spacer in a sidewall of the dummy gate electrode, and ion-implanting the first conductive impurity to be overlapped with the first impurity region by using the spacer as an ion implantation mask, to thus form a second impurity region. Also, the method includes forming a pad polysilicon layer on source and drain regions of the semiconductor substrate, the source/drain regions being defined by the spacer, and sequentially removing the dummy gate upper insulation layer or the spacer, and the dummy gate electrode, and then annealing the semiconductor substrate, and then ion-implanting a second conductive impurity opposite to the first conductive impurity into a gate region of the semiconductor substrate, thus forming third impurity regions. Furthermore, the method includes removing the dummy gate oxide layer and forming a gate insulation layer, and then forming a gate electrode on the gate region.

According to other embodiments of the invention, a method of manufacturing a transistor includes forming a device isolation film on a semiconductor substrate to define an active region, sequentially forming a dummy gate oxide layer, a dummy gate electrode and a dummy gate upper insulation layer on the semiconductor substrate, and ion-implanting a first conductive impurity into source/drain regions provided in both sides of the dummy gate electrode, thus forming first impurity regions. The method includes forming a spacer in a sidewall of the dummy gate electrode, and ion-implanting the first conductive impurity to be overlapped by the first impurity region by using the spacer as an ion implantation mask, thus forming second impurity regions. Also, the method includes removing the dummy gate oxide layer of the source/drain regions, forming a self-alignment pad polysilicon layer on the source/drain regions of the semiconductor substrate, the source/drain regions being defined by the spacer, and sequentially removing the dummy gate upper insulation layer and the dummy gate electrode, and then annealing the semiconductor substrate, and then locally ion-implanting a second conductive impurity opposite to the first conductive impurity into a gate region of the semiconductor substrate, thus forming third impurity regions. Furthermore, the method includes removing the dummy gate oxide layer and forming a gate insulation layer, and then forming a gate electrode on the gate region.

According to still other embodiments of the invention, a method of manufacturing a transistor includes forming a device isolation film on a semiconductor substrate, accumulating a dummy gate oxide layer and a sacrificial oxide layer on the semiconductor substrate on which the device isolation film is formed, and patterning the sacrificial oxide layer and forming a dummy gate electrode on the semiconductor substrate on which the sacrificial oxide layer is formed. The method also includes flattening the semiconductor substrate on which the dummy gate electrode is formed, removing the sacrificial oxide layer, and ion-implanting a first conductive impurity into source/drain regions provided in both sides of the dummy gate electrode, thus forming first impurity regions. Furthermore, the method includes forming a spacer in a sidewall of the dummy gate electrode, and ion-implanting the first conductive impurity to be overlapped by the first impurity region by using the spacer as an ion implantation mask, thus forming a second impurity region. The method also includes removing the dummy gate oxide layer of the source/drain regions, forming a pad polysilicon layer on the semiconductor substrate, flattening it so that the dummy gate electrode is exposed, removing the dummy gate electrode, and annealing the semiconductor substrate. Furthermore, the method includes locally ion-implanting a second conductive impurity opposite that of the first conductive impurity into a gate region of the semiconductor substrate, thus forming third impurity regions, removing the dummy gate oxide layer and forming a gate insulation layer, and then forming a gate electrode on the gate region.

That is, according to embodiments of the invention, a conductive impurity is ion implanted in source/drain regions of a semiconductor substrate to form first impurity regions and second impurity regions. A pad polysilicon layer containing the conductive impurity is formed on the source/drain regions, and the conductive impurity contained into the pad polysilicon layer is diffused to perform an high temperature annealing process in order to repair surface damage to the semiconductor substrate caused by the ion implantation. Furthermore, the channel adjusting impurity is ion implanted into the gate region, separating the first impurity region of the source/drain regions from the channel impurity region and substantially reducing a junction leakage current and a junction electrostatic capacitance.

It will be apparent to those skilled in the art that modifications and variations can be made to the above embodiments of invention without deviating from the spirit or scope of the invention. Thus, it is intended that the invention cover any such modifications and variations of this invention provided they come within the scope of the appended claims and their equivalents.

The invention claimed is:

1. A method of manufacturing a transistor, comprising:
   sequentially forming a dummy gate oxide layer, a dummy gate electrode, and a dummy gate upper insulation layer on a semiconductor substrate;
   ion-implanting first impurities into source/drain regions provided on both sides of the dummy gate electrode to form first impurity regions;
   forming spacers on sidewalls of the dummy gate electrode;
   ion-implanting first impurities using the spacer as an ion implantation mask to form second impurity regions that are overlapped by the first impurity regions;
   depositing pad polysilicon layers on the second impurity regions, the pad polysilicon layers in contact with the spacers;
   removing the dummy gate upper insulation layer and an upper portion of the spacer;
   removing the dummy gate electrode;
   annealing the semiconductor substrate;
   ion-implanting second impurities into a gate region of the semiconductor substrate to form a third impurity region, the second impurities having a conductivity type opposite that of the first impurities;
   removing the dummy gate oxide layer;
   forming a gate insulation layer; and
   forming a gate electrode on the gate region.

2. The method of claim 1, further comprising depositing a device isolation film in a trench in the semiconductor substrate to define a cell region of the substrate and a core/perimeter region of the substrate.

3. The method of claim 2, wherein depositing the device isolation film comprises:
   sequentially forming a pad oxide layer, a molding polysilicon layer, and a hard mask layer on the semiconductor substrate;
   depositing a photoresist on the hard mask layer;
   patterning the photoresist to partially expose the hard mask layer;
   partially etching the molding polysilicon layer, the pad oxide layer, and the semiconductor substrate by using the photoresist as an etching mask to form the trench; and
   thermally oxidizing an interior of the trench to form the device isolation film.

4. The method of claim 1, wherein sequentially forming the dummy gate oxide layer, the dummy gate electrode, and the dummy gate upper insulation layer comprises:
   depositing a photoresist on the dummy gate upper insulation layer;
   patterning the photoresist;
   partially exposing the dummy gate electrode by etching the dummy gate upper insulation layer using the photoresist as an etch mask;
   partially exposing the dummy gate oxide layer by etching the dummy gate electrode using the dummy gate upper insulation layer as an etch mask, thus forming the dummy gate electrode on a gate region; and
   removing the photoresist.

5. The method of claim 1, wherein forming the dummy gate oxide layer comprises performing a wet type thermal oxidation process.

6. The method of claim 1, wherein forming the dummy gate oxide layer comprises forming the dummy gate oxide layer to a thickness of 30 Å to 80 Å.

7. The method of claim 1, wherein forming the dummy gate electrode comprises forming the dummy gate electrode of silicon germanium.

8. The method of claim 1, wherein forming the dummy gate upper insulation layer comprises forming the dummy gate upper insulation layer of silicon nitride.

9. The method of claim 1, wherein forming the dummy gate electrode and the dummy gate upper insulation layer comprise performing a chemical vapor deposition process.

10. The method of claim 1, wherein forming the dummy gate electrode and the dummy gate upper insulation layer comprises forming the dummy gate electrode and the dummy gate insulation layer to a thickness of 1000 Å to 4000 Å.

11. The method of claim 2, wherein ion-implanting first impurities to form first impurity regions comprises ion-implanting N-type impurities in the cell region and implanting N-type impurities in the core/perimeter region.

12. The method of claim 11, wherein ion-implanting N-type impurities comprises ion-implanting impurities selected from the group consisting of P and As.

13. The method of claim 2, wherein ion-implanting first impurities to form first impurity regions comprises ion-implanting N-type impurities in the cell region and ion-implanting P-type impurities in the core/perimeter region.

14. The method of claim 13, wherein ion-implanting N-type impurities comprises ion-implanting impurities selected from the group consisting of P and As; and wherein ion-implanting P-type impurities comprises ion-implanting impurities selected from the group consisting of B and $BF_2$.

15. The method of claim 1, wherein ion-implanting first impurities to form first impurity regions comprises ion-implanting the first impurities into the semiconductor substrate at an energy of about 20 KeV.

16. The method of claim 1, wherein ion-implanting first impurities to form first impurity regions comprises ion-implanting first impurities to a density of about $1 \times 10^{16}$ atoms/cm$^3$.

17. The method of claim 1, wherein ion-implanting first impurities to form first impurity regions comprises ion-implanting first impurities to a depth of about 1000 Å to 2000 Å from a surface of the semiconductor substrate.

18. The method of claim 1, further comprising annealing the semiconductor substrate after forming the first impurity regions.

19. The method of claim 1, further comprising, after forming the first impurity regions, ion-implanting second impurities to form a channel stop layer that invades a portion of the gate region.

20. The method of claim 19, wherein ion-implanting the second impurities to form the the channel stop layer comprises ion-implanting the second impurities at an energy of about 50 KeV.

21. The method of claim 19, wherein ion-implanting the second impurities to form the channel stop layer comprises ion-implanting the second impurities below 2000 Å from the surface of semiconductor substrate.

22. The method of claim 1, wherein forming spacers comprises forming a layer chosen selected from the group consisting of a silicon nitride layer or a silicon oxide nitride layer.

23. The method of claim 1, wherein forming spacers comprises forming spacers on the dummy gate upper insulation layer.

24. The method of claim 1, wherein ion-implanting first impurities to form second impurity regions comprises ion-implanting first impurities into the semiconductor substrate at an energy of about 50 KeV.

25. The method of claim 1, wherein ion-implanting first impurities to form second impurity regions comprises ion-implanting second impurities to a density of about $1\times10^{19}$ atoms/cm$^3$.

26. The method of claim 1, wherein ion-implanting first impurities to form second impurity regions comprises ion-implanting first impurities to a depth under 2000 Å from a surface of semiconductor substrate.

27. The method of claim 2, wherein ion-implanting first impurities to form second impurity regions comprises:
    forming an interlayer insulation layer on a face of the semiconductor substrate;
    flattening the interlayer insulation layer; and
    removing the interlayer insulation layer formed in the cell region and forming the second impurity region in the cell region.

28. The method of claim 27, further comprising removing the dummy gate oxide layer on the source/drain region of the cell region.

29. The method of claim 27, wherein the interlayer insulation layer is formed of silicon nitride.

30. The method of claim 27, wherein flattening the interlayer insulation layer comprises a chemical mechanical polishing (CMP) or an etch-back.

31. The method of claim 1, wherein ion-implanting first impurities to form second impurity regions comprises ion-implanting first impurities through a self-alignment method in which the dummy gate upper insulation layer and the spacer are used as an ion implantation mask.

32. The method of claim 1, wherein depositing pad polysilicon layers comprises chemical vapor deposition of the pad polysilicon layers.

33. The method of claim 1, wherein depositing pad polysilicon layers comprises adding a conductive impurity to the pad polysilicon layers.

34. The method of claim 1, further comprising flattening the semiconductor substrate on which the pad polysilicon layer is formed with a chemical-mechanical polishing process to expose a portion of the dummy gate upper insulation layer or the spacer.

35. The method of claim 1, wherein removing the dummy gate upper insulation layer comprises anisotropically etching a portion of the dummy gate upper insulation layer from the dummy gate electrode.

36. The method of claim 1, wherein removing the dummy gate electrode comprises anisotropically etching the dummy gate electrode.

37. The method of claim 1, wherein removing the dummy gate electrode comprises dry etching the dummy gate electrode.

38. The method of claim 1, wherein annealing the semiconductor substrate comprises annealing at a temperature between about 800~830° C.

39. The method of claim 1, wherein annealing the semiconductor substrate comprises annealing for at least one hour.

40. The method of claim 1, wherein ion-implanting second impurities to form third impurity regions comprises ion-implanting second impurities to a depth of about 500 Å to 1000 Å from the surface of semiconductor substrate.

41. The method of claim 1, wherein ion-implanting second impurities to form third impurity regions comprises ion-implanting second impurities into the semiconductor substrate at an energy of about 20 KeV.

42. The method of claim 1, wherein ion-implanting second impurities to form third impurity regions comprises ion-implanting second impurities to a density of about $1\times10^{16}$ atoms/cm$^3$.

43. The method of claim 1, wherein annealing the semiconductor substrate comprises annealing after forming third impurity regions.

44. The method of claim 1, wherein forming the dummy gate oxide layer comprises thermally oxidizing the semiconductor substrate.

45. The method of claim 44, wherein thermally oxidizing comprises thermally oxidizing at about 800° C.

46. The method of claim 1, wherein forming the gate electrode comprises forming the gate electrode of polycrystalline silicon.

47. The method of claim 46, wherein forming the gate electrode of polycrystalline silicon comprises forming the gate electrode of polycrystalline silicon that contains a conductive impurity.

48. The method of claim 1, wherein forming the gate electrode comprises forming the gate electrode to a thickness of about 500 Å to 2000 Å.

49. The method of claim 1, further comprising, after forming the gate electrode:
    forming a conductive metal layer on the semiconductor substrate where the gate electrode is formed;
    flattening the conductive metal layer with a chemical-mechanical polishing process until the pad polysilicon layers are exposed; and
    isolating the gate electrode from the pad polysilicon layers by etching the gate electrode.

50. A method of manufacturing a transistor, comprising:
    depositing a device isolation film on a semiconductor substrate to define an active region;
    sequentially depositing a dummy gate oxide layer, a dummy gate electrode, and a dummy gate upper insulation layer on the semiconductor substrate;
    ion-implanting a first conductive impurity to form first impurity regions, the first impurity regions disposed in source/drain regions provided on both sides of the dummy gate electrode;
    forming a spacer on a sidewall of the dummy gate electrode;
    ion-implanting the first conductive impurity to form second impurity regions that are overlapped by the first impurity regions by using the spacer as an ion implantation mask;
    removing the dummy gate oxide layer from the source/drain regions;
    forming self-aligned pad polysilicon layers that are defined by the spacer on the source/drain regions of the semiconductor substrate;
    sequentially removing the dummy gate upper insulation layer and the dummy gate electrode;

annealing the semiconductor substrate;

locally ion-implanting a second conductive impurity into a gate region of the semiconductor substrate to form a third impurity region, the second conductive impurity having an impurity type opposite that of the first conductive impurity; and removing the dummy gate oxide layer;

forming a gate insulation layer; and forming a gate electrode on the gate region.

51. A method of manufacturing a transistor, comprising:

forming a device isolation film on a semiconductor substrate;

accumulating a dummy gate oxide layer and a sacrificial oxide layer on the semiconductor substrate on which the device isolation film is formed;

patterning the sacrificial oxide layer and forming a dummy gate electrode on the semiconductor substrate on which the sacrificial oxide layer is formed;

flattening the semiconductor substrate on which the dummy gate electrode is formed;

removing the sacrificial oxide layer;

ion-implanting a first conductive impurity to form first impurity regions, the first impurity region disposed in source/drain regions provided on both sides of the dummy gate electrode;

forming a spacer on a sidewall of the dummy gate electrode;

ion-implanting the first conductive impurity to form second impurity regions that are overlapped by the first impurity regions by using the spacer as an ion implantation mask;

removing the dummy gate oxide layer from the source/drain regions;

forming a pad polysilicon layer on the semiconductor substrate;

flattening the pad polysilicon layer to expose the dummy gate electrode;

removing the dummy gate electrode;

annealing the semiconductor substrate;

locally ion-implanting a second conductive impurity into a gate region of the semiconductor substrate to form a third impurity region, the second conductive impurity having a conductivity type opposite that of the first conductive impurity; and removing the dummy gate oxide layer;

forming a gate insulation layer; and forming a gate electrode on the gate region.

* * * * *

UNITED STATES PATENT AND TRADEMARK OFFICE
CERTIFICATE OF CORRECTION

PATENT NO. : 7,265,011 B2 Page 1 of 1
APPLICATION NO. : 10/898484
DATED : September 4, 2007
INVENTOR(S) : Jae-Man Yoon et al.

It is certified that error appears in the above-identified patent and that said Letters Patent is hereby corrected as shown below:

Column 3, line 4, the word "11" should read -- 1l --;
Column 3, line 63, the word "Is" should read -- 1s --;
Column 7, line 19, the word "21" should read -- 2l --;
Column 12, line 16, the word "31" should read -- 3l --;
Column 18, line 63, the words "the the" should read -- the --.

Signed and Sealed this

Sixteenth Day of September, 2008

JON W. DUDAS
*Director of the United States Patent and Trademark Office*